(12) United States Patent
Avci et al.

(10) Patent No.: US 11,723,188 B2
(45) Date of Patent: Aug. 8, 2023

(54) REPLACEMENT METAL COB INTEGRATION PROCESS FOR EMBEDDED DRAM

(71) Applicant: Intel Corporation, Santa Clara, CA (US)

(72) Inventors: Uygar Avci, Portland, OR (US); Ian Young, Portland, OR (US); Daniel Morris, Hillsboro, OR (US); Seiyon Kim, Portland, OR (US); Yih Wang, Portland, OR (US); Ruth Brain, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1083 days.

(21) Appl. No.: 16/024,578

(22) Filed: Jun. 29, 2018

(65) Prior Publication Data

US 2020/0006346 A1    Jan. 2, 2020

(51) Int. Cl.
*H01L 23/522* (2006.01)
*H01L 21/768* (2006.01)
*H10B 12/00* (2023.01)
*H01L 49/02* (2006.01)

(52) U.S. Cl.
CPC ..... *H10B 12/315* (2023.02); *H01L 21/76808* (2013.01); *H01L 21/76843* (2013.01); *H01L 23/5226* (2013.01); *H01L 28/91* (2013.01); *H10B 12/033* (2023.02); *H10B 12/50* (2023.02)

(58) Field of Classification Search
CPC ......... H01L 27/10814; H01L 21/76808; H01L 21/76843; H01L 23/5226; H01L 27/10852; H01L 27/10897; H01L 28/91; H01L 28/90; H01L 23/5223; H10B 12/315; H10B 12/033; H10B 12/50
See application file for complete search history.

(56) References Cited

U.S. PATENT DOCUMENTS

| 9,147,689 | B1* | 9/2015 | Chavan | H01L 21/2236 |
| 2005/0170599 | A1* | 8/2005 | Joo | H01L 28/91 |
| | | | | 257/E21.648 |
| 2011/0256717 | A1* | 10/2011 | Choi | H01L 27/11568 |
| | | | | 438/653 |
| 2013/0285203 | A1* | 10/2013 | Hiroi | H01L 27/10852 |
| | | | | 257/532 |

* cited by examiner

*Primary Examiner* — David Vu
(74) *Attorney, Agent, or Firm* — Schwabe, Williamson & Wyatt P.C.

(57) ABSTRACT

Embodiments include an embedded dynamic random access memory (DRAM) device, a method of forming an embedded DRAM device, and a memory device. An embedded DRAM device includes a dielectric having a logic area and a memory area, and a trace and a via disposed in the logic area of dielectric. The embedded DRAM device further includes ferroelectric capacitors disposed in the memory area of dielectric, where each ferroelectric capacitor includes a first electrode, a ferroelectric layer, and a second electrode, and where the ferroelectric layer surrounds the first electrode of each ferroelectric capacitor and extends along a top surface of the dielectric in the memory area. The embedded DRAM device includes an etch stop layer above the dielectric. The second etch stop in the logic area may have a z-height that is approximately equal to a z-height of a top surface of the second etch stop in the memory area.

16 Claims, 14 Drawing Sheets

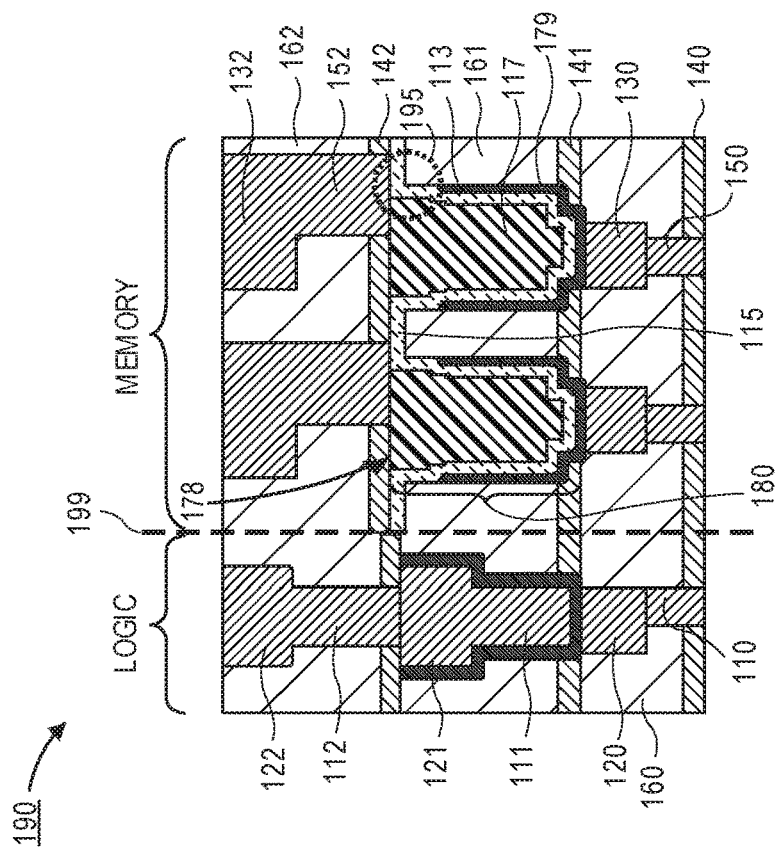
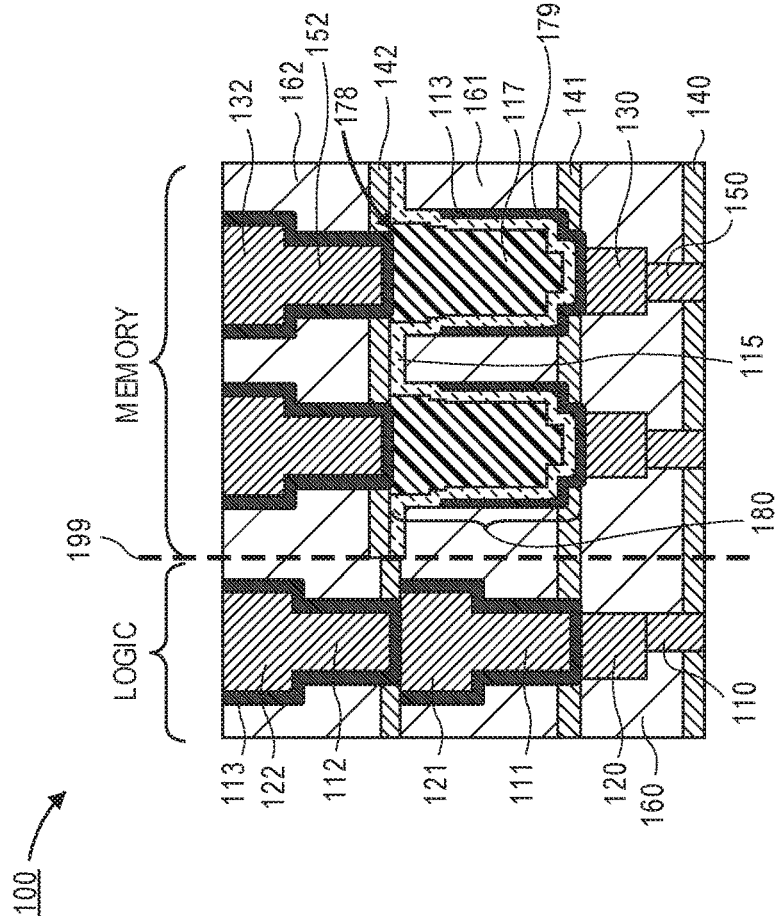
FIG. 1A
FIG. 1B

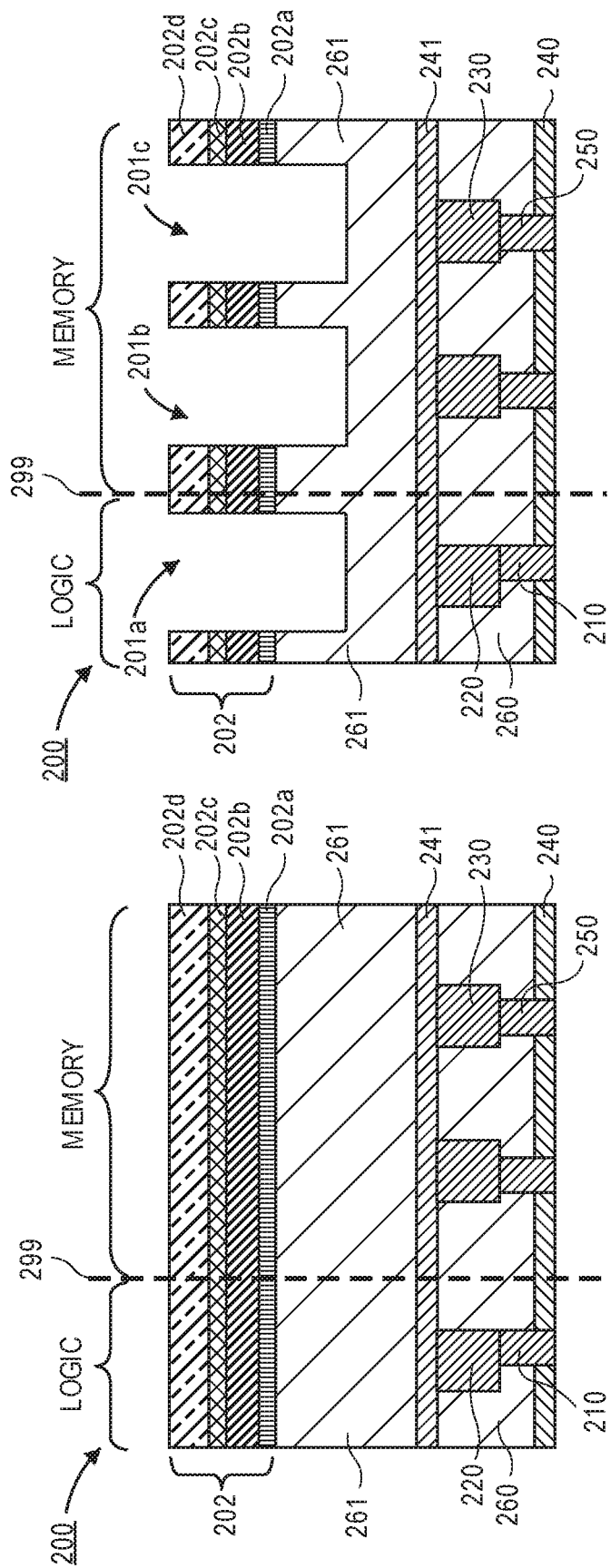

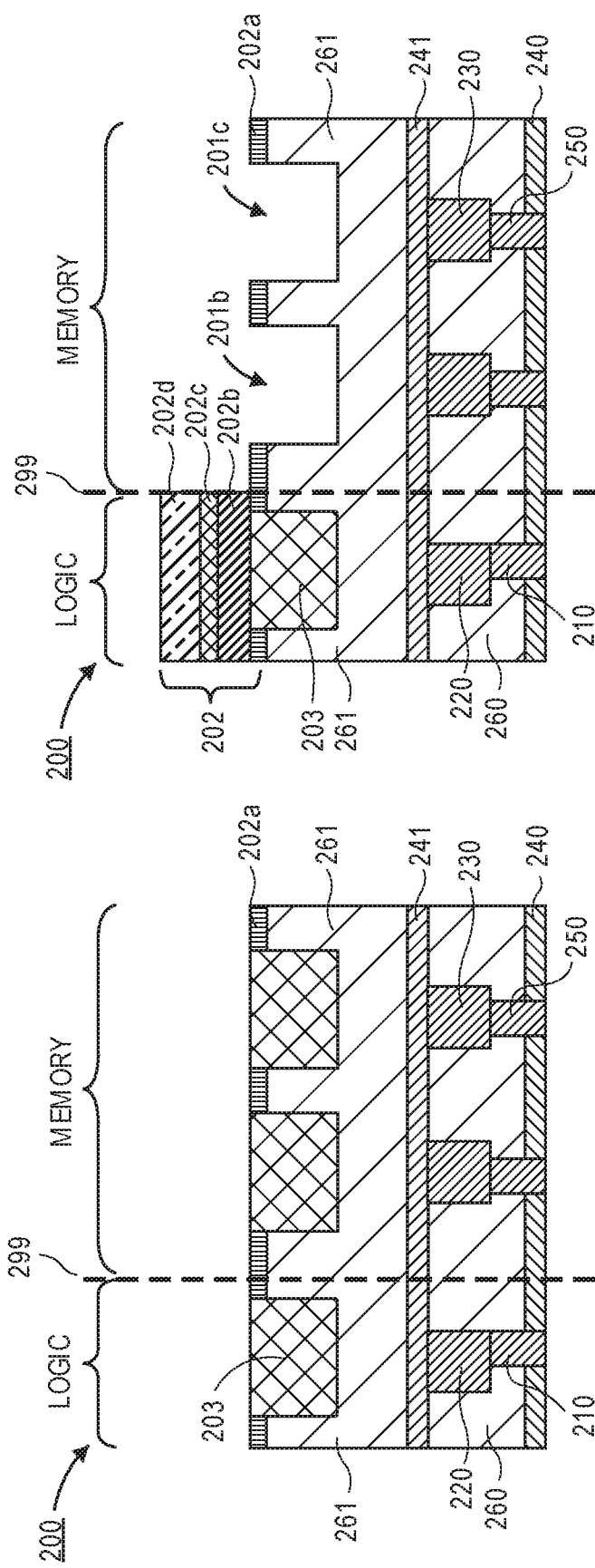

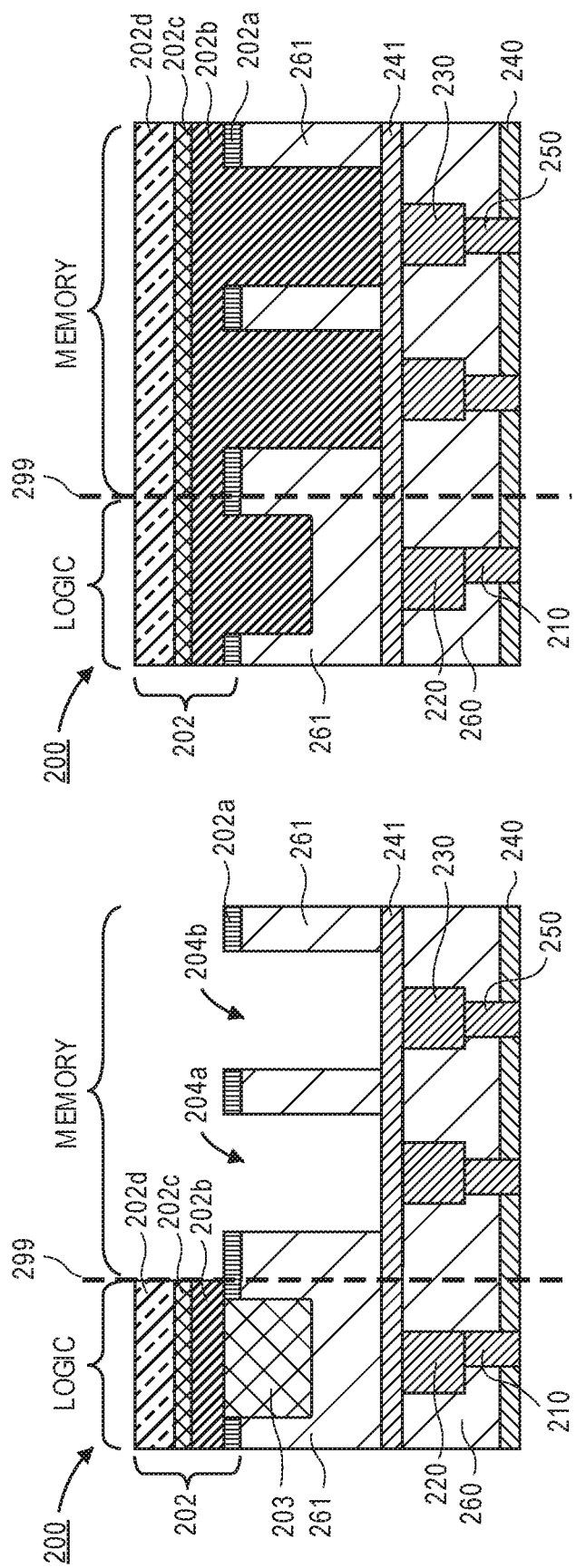

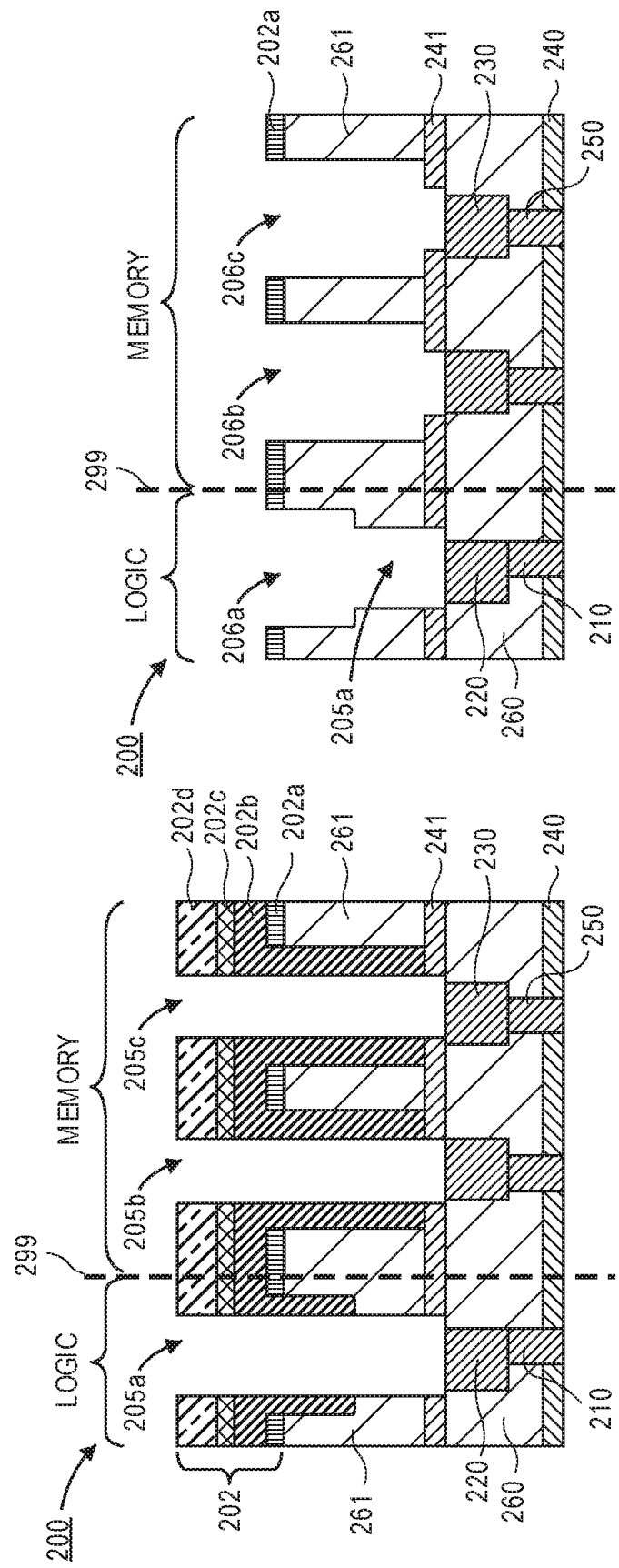

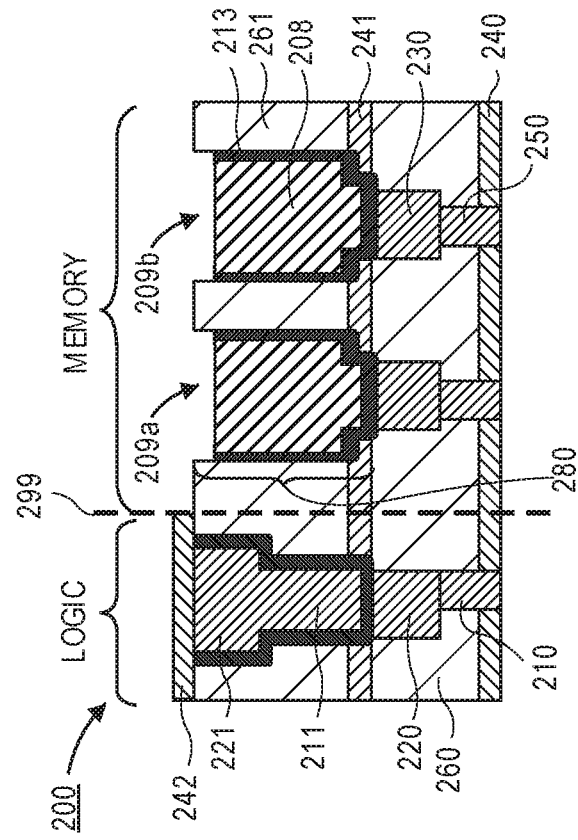
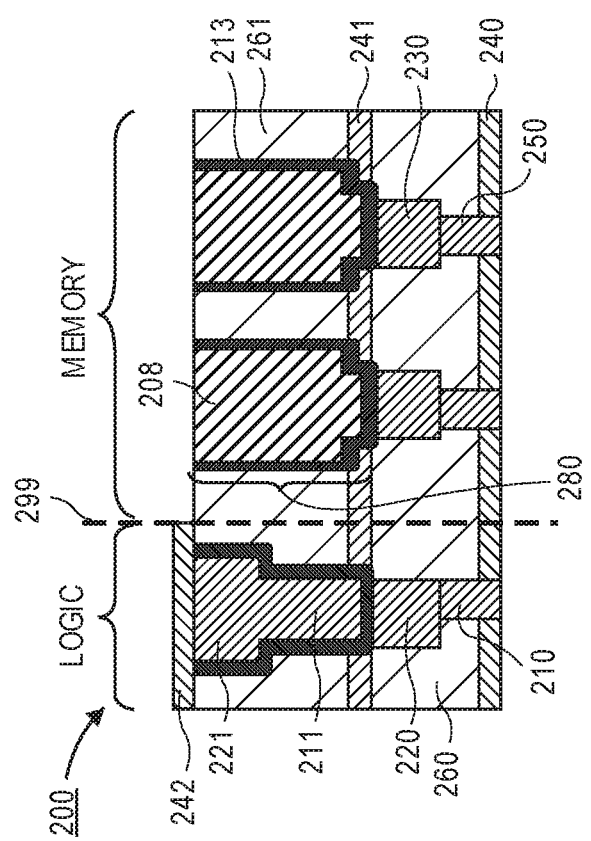

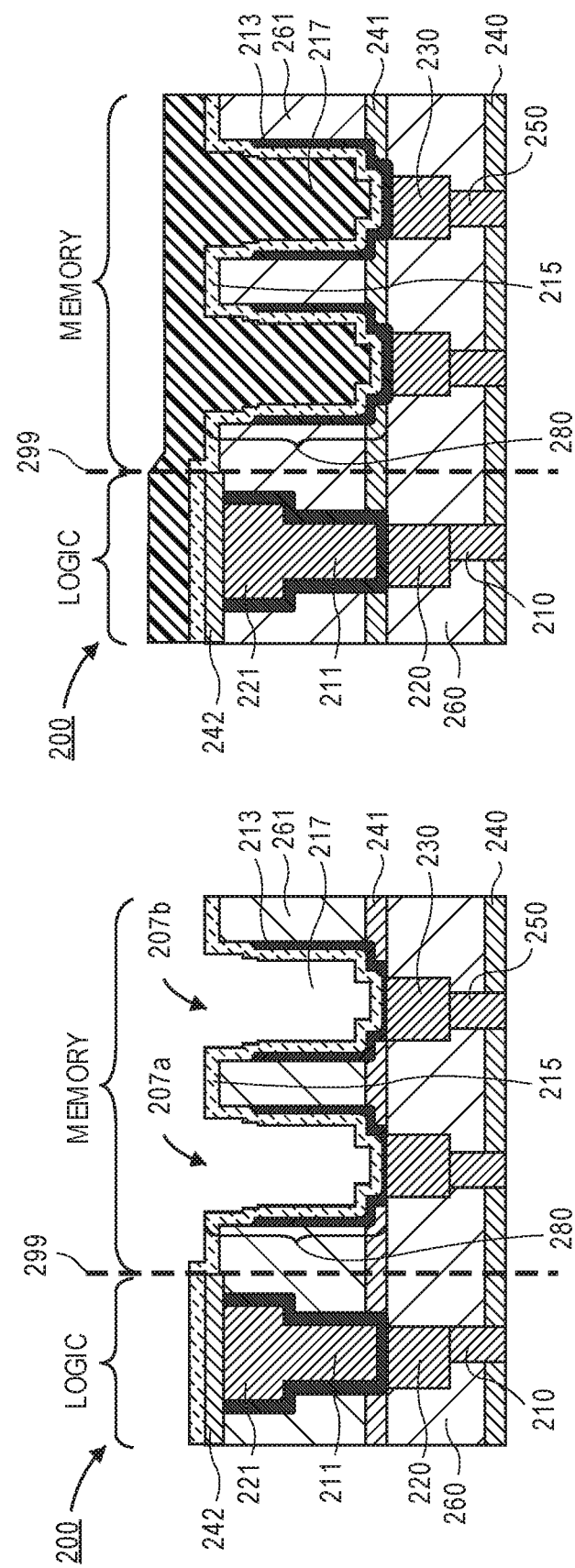

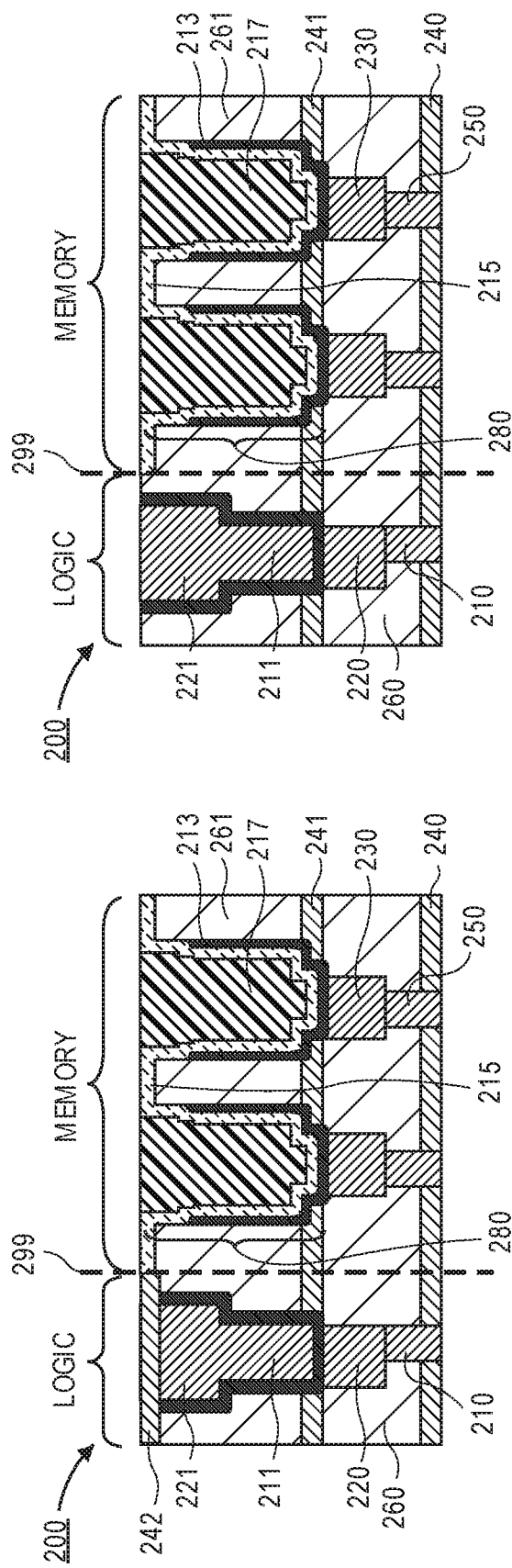

REPLACEMENT METAL COB INTEGRATION PROCESS FOR EMBEDDED DRAM

FIELD

Embodiments relate to semiconductor structures and processing. More particularly, the embodiments relate to an embedded dynamic random access memory (DRAM) device having a high-k ferroelectric layer disposed below an electrode layer of a capacitor over bitline (COB) and an etch stop layer using a replacement COB integration technique.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Existing packaging solutions may implement a one-transistor, one-capacitor (1T-1C) dynamic random access memory (DRAM) (1T-1C DRAM), a standard 6 transistor (6T) static random-access memory (SRAM) (6T-SRAM), and/or an off-chip high density memory (e.g., a commodity high bandwidth memory (HBM) DRAM (HBM DRAM)). These existing packaging solutions nevertheless have limitations and problems.

One existing solution includes the 6T-SRAM that is used as cache and generally offers one of the fastest on-chip memory solutions. The 6T-SRAM, however, requires 6 transistors and is thus not desired for a scaling solution. With respect to a conventional DRAM, this memory device is typically integrated with central processing unit (CPU) inside packages rather than monolithically integrated with existing highly-scaled microprocessors. Meanwhile, with respect to the HBM DRAM, this HBM DRAM device is implemented for scaling and faster solutions but generally requires a three-dimensional (3D) stacking comprised of through silicon vias (TSVs) and micro-bumps.

Additionally, any off-chip high density memory, including the HBM DRAM, face several performance limitations due to the bus width between the DRAM cell and the CPU, the slower speeds compared to a true embedded memory, and the impediment of not being able to utilize the on-chip interconnects which have higher bandwidths. With respect to the 1T-1C DRAM, this memory device typically has higher bits per area than the 6T-SRAM, but has problems monolithically integrating with logic devices due to the difference in critical dimensions and processes.

One of the main monolithic integration problems with the conventional DRAM device includes integrating a capacitor over bitline (COB) in the metal layers of a logic device with a top hat metal layer directly on the COB. This generates a height difference between the memory area and the logic area, which results in a transition region that cannot be used by the device and in a wasted area that reduces the benefit of a small cell size. An existing solution for this topographic height difference typically involves landing the top via directly on the COB without the top HAT metal layer. However, this solution also has problems as a slight misalignment in the DRAM device leads to an electrical short between the top via and the bottom electrode of the COB. Another major monolithic integration problem with the conventional DRAM process is that the metal layers in the logic area and the COB memory area are formed with separate lithographic and etching processes, which results in an increased process complexity, an increase cost, and a cross impact between the logic and memory areas.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIG. 1A is an illustration of a cross-sectional view of an embedded dynamic random access memory (DRAM) device including one or more capacitors over bitlines (COBs) and a high-k ferroelectric layer, where the high-k ferroelectric layer surrounds an electrode layer and extends along a top surface of an interlayer dielectric (ILD) layer, according to one embodiment.

FIG. 1B is an illustration of a cross-sectional view of an embedded DRAM device including one or more COBs and a high-k ferroelectric layer, where the high-k ferroelectric layer surrounds an electrode layer, extends along a top surface of an ILD layer, and couples a bottom surface of a misaligned via, according to one embodiment.

DETAILED DESCRIPTION

Figure 2J:
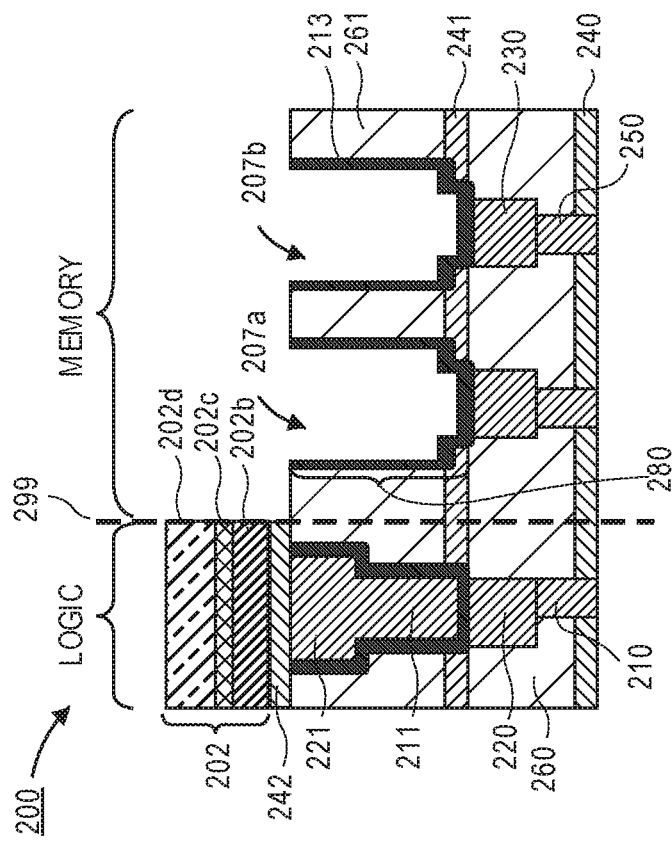
FIGS. 2A-2T are illustrations of cross-sectional views of a process flow of forming an embedded DRAM device including one or more COBs and a high-k ferroelectric layer, where the high-k ferroelectric layer surrounds an electrode layer and extends along a top surface of an ILD layer, according to some embodiment.

Embodiments described herein include an embedded dynamic random access memory (DRAM) device including one or more capacitors over bitlines (COBs) (e.g., ferroelectric capacitors) and a high-k ferroelectric layer that is disposed over electrode layers of the COBs and extended along a top surface of an interlayer dielectric (ILD) layer. The embodiments described herein may implement a replacement metal COB integration technique to form such embedded DRAM device. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as integrated circuit design layouts such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

As used herein, the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Likewise, certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating (or forming) an embedded DRAM device including one or more COBs and a high-k ferroelectric layer, where the high-k ferroelectric layer surrounds an electrode layer of a COB and extends along a top surface of an ILD layer. Note that, in some embodiments, the ferroelectric layer may be formed of one or more materials that do not have high-k properties (i.e., the ferroelectric layer described herein is not limited to high-k materials). The embedded DRAM device described herein may be implemented in one or more components associated with an integrated circuit (IC) and/or between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in, for example, a computer.

Additionally, the embodiments described herein may be implemented further in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including an electronic device employing one or more embedded DRAM devices having one or more COBs and a high-k ferroelectric layer that surrounds an electrode layer of a COB and extends along a top surface of an interlayer dielectric (ILD) layer (e.g., as shown below in FIGS. 1A-1B).

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As described above, one of the main problems with the existing DRAM device is the difficulty to monolithically integrate with logic devices due to the difference in critical dimensions and processes—even though the existing DRAM device has higher bits per area than the existing SRAM device (e.g., a 6T-SRAM).

Accordingly, embodiments described herein include an embedded DRAM device having a high-charge and polarizing ferroelectric capacitor which enables (i) decreasing the overall z-height of such device and (ii) reducing the need (or desire) for a deep COB trench (e.g., as typically required by existing DRAMs). Additionally, the embodiments described herein facilitate forming the embedded DRAM devices using a COB process, which (i) is similar to the baseline metal/via process used for COBs and (ii) helps reduce the overall cost of the embedded DRAM device.

For some embodiments, the embedded DRAM device enables a top via to be directly disposed on/above a COB—without needing a top hat metal layer—by using a high-k ferroelectric layer (i) that acts as a blocking layer to prevent any electrical shorting (e.g., as shown with the embedded DRAM device 190 of FIG. 1B), and (ii) that enables a negligible (or minimal) topology z-height difference between the memory and the logic areas, thus reducing the transition region for pitch grading. In addition, the embodiments described herein enhance the embedded DRAM technology by providing denser memory solutions (e.g., as compared to a SRAM device) and faster solutions that may be used to replace, for example, a cache memory in a central processing unit (CPU).

FIG. 1A is an illustration of a cross-sectional view of an embedded DRAM device 100 including one or more COBs 180 and a high-k ferroelectric layer 115, where the high-k ferroelectric layers 115 surrounds an electrode layer 113 and extends along a top surface of a second ILD layer 161, according to one embodiment. FIG. 1B is an illustration of a cross-sectional view of an embedded DRAM device 190 including the one or more COBs 180 and the high-k ferroelectric layer 115, where the high-k ferroelectric layers 115 surrounds the electrode layer 113, extends along the top surface of the second ILD layer 161, and couples a bottom surface of a misaligned via 152, according to one embodiment. In addition, FIG. 1B illustrates the embedded DRAM device 190 that is similar to the embedded DRAM device 100 of FIG. 1A, but the embedded DRAM device 190 may have a misalignment that causes the vias 152 to be disposed on the COBs 180 and the high-k ferroelectric layer 115 rather than being disposed directly above the COBs 180.

As shown in FIGS. 1A-1B, the embedded DRAM devices 100 and 190 have a minimal topographic difference (or a z-height difference) between the memory and logic areas. Additionally, in some embodiments when misalignment is involved, the embedded DRAM device 190 uses the high-k ferroelectric layer 115 (also referred to as the ferroelectric layer) to block any via etching that may attempt entrenching (or attacking) the second ILD 161 and to block any electrical shorting with the electrode 113 (or the bottom electrode) of the COB 180. In some embodiments, the high-k ferroelectric layer 115 may be a hafnium-based (Hf-based) ferroelectric material with high-k properties which enables the high-k ferroelectric layer 115 to be highly resistive to oxide etching. Additionally, in some embodiments, the high-k ferroelectric layer 115 may have a thickness of approximately 5 nm, while in other embodiments the high-k ferroelectric layer 115 may have a thickness between approximately 2 nm to 10 nm.

As used herein, the terms chip, integrated circuit (IC), monolithic device, semiconductor device, semiconductor package, and microelectronic device, are often used interchangeably in the semiconductor packaging field, and thus the embodiments described herein may be applicable to all of the above as known in this field.

As used herein, the terms metal line, interconnect line, trace, wire, conductor, signal path, and signaling medium are all related and often used interchangeably. Furthermore, as used herein, a "metal layer" (e.g., a first metal layer (M1, and so on) refers to a conductive layer that may include traces, wires, lines, interconnects, and/or any metal formations. For example, the metal layer may include one or more materials, such as aluminum (Al), copper (Cu), and/or an alloy of Al and Cu, that are used as conductors to provide signal paths for coupling or interconnecting, electrical circuitry. In addition, the metal layer may include a metal trace coupled to a via, where the via (or contact) may refer to a conductive structure used to electrical couple/connect conductors, such as metal traces, from different interconnect levels.

Referring back to FIG. 1A, in some embodiments, the embedded DRAM device 100 may be or include a memory device, while in other embodiments the embedded DRAM device 100 may be or include a part of a memory device or some other type of IC. In some embodiments, the embedded DRAM device 100 may implement a substrate as a mechanical base for the embedded DRAM 100, where for example the bottommost metal layer (e.g., including the metal traces 120 and 130 and the vias 110 and 150) may be used to couple the circuitry of the embedded DRAM 100 device to the substrate. Conversely, in other embodiments, the embedded DRAM device 100 may implement the substrate as the mechanical base for the embedded DRAM device 100—without using the substrate itself for the circuitry of the embedded DRAM device 100.

In accordance with an embodiment, one or more (and possibly all) portions of the embedded DRAM device 100 may be spatially segmented with an interface 199 between, for example, lower-k logic regions and higher-k memory (or DRAM) regions. In an embodiment, the interface 199 may be an abrupt interface. In another embodiment, the interface 199 may be a graded interface. Note that, in some embodiments, the interface 199 is not a physical seam as the spatially segmented ILD layers 160-162 are formed from a continuous ILD layer.

For some embodiments, the embedded DRAM device 100 may include one or more metal traces 120-122 and 130-132, one or more vias 110-112 and 150-152, one or more ILD layers 160-162, and one or more ferroelectric capacitors 180 formed thereof. Moreover, the embedded DRAM device 100 may further include various additional circuitry in addition to the illustrated logic and memory areas. For example, the circuitry may include one or more IC components, such as address decoders, line drivers, sense amplifiers, charge-pumps, state machines, and/or various other types of circuitry.

The embedded DRAM device 100 has three metal layers (M1, M2, and M3) which are illustrated, but note that, in some embodiments, the embedded DRAM device 100 may have a single metal layer or more based on the desired packaging design/application. Each metal layer may include a metal trace and a metal via where the trace and the via are electrically coupled. As used herein, the first metal layer may be referred to as M1, the second metal layer may be referred to as M2, and so on. Additionally, as used herein, the M1 layer 130 may refer to both the first metal trace (also referred to as the M1 trace) 130 and the first via 150 (also referred to as the M1 via) for simplicity purposes, rather than only referring to the first metal trace 130.

The embedded DRAM device 100 may include disposing the M2 layer 121 and the COBs 180 on the M1 layers 120 and 130, and then disposing the M3 layers 122 and 132 on the M2 layer 121 and the COBs 180. In some embodiments, the M1-M3 layers may be formed with a replacement metal COB integration process (as shown below in FIGS. 2A-2T) using any conventional lithographic patterning and plating process or the like. The embedded DRAM device may also include disposing each of the M1-M3 layers in the ILD layers 160-162, respectively. The embedded DRAM device 100 may further include disposing the vias 110-112 and 150-152 on one or more etch stop layers 140-142, respectively. The embedded DRAM device 100 may form the COBs 180 which may include ferroelectric capacitors. The ferroelectric capacitors 180 may include one or more ferroelectric material.

For some embodiments, the ferroelectric capacitors 180 may be formed in the z-axis of a three-dimensional (3D) circuitry of the embedded DRAM device 100. It is to be appreciated that although in the illustrations the ferroelectric capacitors 180 are shown embedded into the corresponding memory M2 layer, the ferroelectric capacitors 180 may be embedded into any other memory metal layers. In some embodiments, the embedded DRAM device 100 initially includes patterning one or more trenches 179 and one or more trench openings 178 that may be used to form the one or more ferroelectric capacitors 180. In some embodiments, the trenches 179 have a thickness (or a depth) approximately defined from a top surface of the M1 trace 130 to a bottom surface of the M3 via 152. The trenches 179 may be formed with an etching process such as dry etching, wet etching, any combination thereof, and/or the like.

For some embodiments, after the formation of the trenches 179, the embedded DRAM device 100 may form the ferroelectric capacitors 180 by disposing one more bottom electrode layers 113 (also referred to as first electrode layers), the one or more high-k ferroelectric layers 115 (or a plurality of layers comprising of one or more ferroelectric materials), and one or more top electrode layers 117 (also referred to as second electrode layers) into the trenches 179. The embedded DRAM device 100 may then implement a polishing process to polish/flatten the top surface of the top electrode layers 117 for each of the ferroelectric capacitors 180. As such, in these embodiments, the high-k ferroelectric layers 115 may be disposed over the bottom electrode layers 113 and the ILD layer 161, where the high-k ferroelectric layers 115 may extend along the outer edges of the trenches 179 and also extend along the top surface of the ILD layer 161.

The ferroelectric capacitor 180 has the high-k ferroelectric layer 115 disposed between the top electrode layer 117 and the bottom electrode layer 113, and also disposed between the etch stop layer 142 and the ILD layer 161. The high-k ferroelectric layer 115 includes one or more ferroelectric materials. The high-k ferroelectric layer 115 may include one or more materials that exhibit sufficient ferroelectric behavior properties, even at thin/small dimensions as typically used in such scaled cells as the ones described herein. For example, the one or more ferroelectric materials may include, but are not limited to, hafnium zirconium oxide (HfZrO, also referred to as HZO), silicon-doped (Si-doped) hafnium oxide, germanium-doped (Ge-doped) hafnium oxide, aluminum-doped (Al-doped) hafnium oxide, and/or yttrium-doped (Y-doped) hafnium oxide. In some embodiments, the high-k ferroelectric layer 115 may have a thickness between approximately 5 nm to 10 nm.

Additionally, the ferroelectric capacitor 180 includes the bottom electrode layer 113 (also referred to as a first electrode layer) disposed between the ILD layer 161 and the high-k ferroelectric layer 115. Likewise, the ferroelectric capacitor 180 includes the top electrode layer 117 (also referred to as a second electrode layer) disposed between the high-k ferroelectric layer 115 and the surfaces of the M3 layer (e.g., the M3 vias 152 and/or the layer 113 surrounding the M3 vias 152) and the etch stop layer 142. In some embodiments, each of the bottom and top electrode layers 113 and 117 may include one or more conductive materials (or metals), including ruthenium, tungsten, copper, aluminum, tantalum nitride, titanium nitride, and/or any stack or other combination of these metals. In other embodiments, the bottom and top electrode layers 113 and 117 may also include different materials from each other to help with the different requirements of the bottom and top capacitor plates. Specific annealing and deposition temperatures of these metals and their crystalline quality may be selected to improve the quality of the ferroelectric capacitors 180. According to some embodiments, the bottom and top electrode layers 113 and 117 may have a similar thickness between approximately 2 nm to 10 nm, or in other embodiments may have different thickness, where each of the bottom and top electrode layers 113 and 117 may have a thickness between approximately 3 nm to 9 nm.

In some embodiments, the bottom electrode layer 113 may be an electrically insulating sidewall that may include an oxide, e.g., silicon oxide, or in others embodiments the bottom electrode layer 113 may include a nitride, e.g., silicon nitride. In other embodiments, the bottom electrode layer 113 is a tantalum nitride (TaN) layer. In other embodiments, the bottom electrode layer 113 may also be referred to as a "thin via" layer that surrounds the respective via and/or trace. In other embodiments, the bottom electrode layer 113 may include any insulating material, e.g., one or more polymer materials. In one embodiment, the bottom electrode layer 113 may be disposed/deposited onto the ILD layers 161-162 as a spacer using a blanket deposition technique, e.g., CVD, sputtering, or any other know thin film deposition technique.

In various embodiments, each of the M1-M3 layers may include one or more electrically conductive materials such as any suitable electrically conductive material, alloy, or a stack of multiple electrically conductive materials. In an embodiment, the M1-M3 traces 120-122 and 130-132 and the M1-M3 vias 110-112 and 150-152 may be comprised of one or more metal or other conductive materials. A common example is the use of Cu traces and structures that may or may not include barrier layers between the Cu and the surrounding ILD layer. As used herein, metal materials may include alloys, stacks, and/or any other combinations of multiple metals. In some embodiments, the one or more conductive materials described herein may also include metals or metal alloys, including, for example, ruthenium, palladium, platinum, cobalt, nickel, hafnium, zirconium, titanium, tantalum, and/or aluminum. In some embodiments, various electrically conductive materials described herein may also include one or more electrically conductive alloys oxides or carbides of one or more metals. For some embodiments, the M1-M3 layers may be formed using any suitable known deposition and patterning techniques, such as, for example, dual damascene process techniques, atomic layer deposition (ALD), chemical vapor deposition (CVD), physical vapor deposition (PVD), and any other various lithographic techniques (e.g., photolithography or electron-beam lithography).

For some embodiments, the ILD layers 160-162 may include one or more dielectric materials having a high-k dielectric, such as elements include hafnium, silicon, oxygen, titanium, tantalum, lanthanum, aluminum, zirconium, barium, strontium, yttrium, lead, scandium, niobium, and/or zinc. As used herein, a "high-k dielectric" refers to a material having a higher dielectric constant (k) than silicon oxide, where the terms "oxide," "carbide," "nitride," etc. refer to compounds containing, respectively, oxygen, carbon, nitrogen, etc. Examples of high-k materials that may be used in the ILD layers 160-162 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and/or lead zinc niobate.

In other embodiments, the ILD layers 160-162 may be formed using dielectric materials having low-k dielectric materials. Examples of such dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and/or organosilicates, such as silsesquioxane, siloxane, or organosilicate glass. For some embodiments, the ILD layers 160-162 may include pores or air gaps to further reduce their dielectric constant. In some embodiments, the etch layers 140-142 may include one or more etch resistant materials, such as, but not limited to TiO, ZrO, AlN, ZrAlTiO, AlO, and/or the like.

Note that, as described above, the M1 vias 110 and 150 (or the bottommost metal layer) may be disposed/formed or carried out on a substrate, such as a package substrate, a printed circuit board (PCB), and/or a motherboard. In one embodiment, the substrate may be a crystalline substrate formed using a bulk silicon or a silicon-oninsulator substructure. In other embodiments, the substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, and/or other combinations of group III-V, group II-VI, or group IV materials. Although a few examples of materials from which the substrate may be formed are described here, any material that may serve as a foundation (or a foundation layer) upon which a semiconductor device may be built may be included (or considered) a substrate.

According to some embodiments, one or more types of memory cells may utilize such techniques described herein, including, but are not limited to, an embedded SRAM, an embedded capacitor-based memory needing large ferroelectric capacitors, an embedded DRAM, a floating gate flash memory, a charge-trap flash memory, a phase-change memory, a phase change memory with a switch, a resistive memory, and/or an ovonic memory. Additionally, one or more memory technologies are capable of being implemented with the MML interconnect structure integrated with the ferroelectric capacitors described herein, including emerging technologies such as high density embedded SRAM for scaled technology generations, ferroelectric transistor random access memory (FeTRAM), nanowire technology, and/or any other future technologies.

Note that the embedded DRAM device 100 of FIG. 1A may include fewer or additional packaging components and/or materials based on the desired packaging design.

FIG. 1B illustrates an embedded DRAM device 190 which is similar to the embedded DRAM device 100 of FIG. 1A, but the embedded DRAM device 190 has a misalignment 195 with the M3 traces 132 and vias 152 in the memory area. As described above, even in the embodiments involving misalignment 195, the embedded DRAM device 100 may have exposed portions of the high-k ferroelectric layers 115 extending along the top surface of the second ILD layer 161 which may be couple to the bottom surface of the M3 vias 152 to prevent any electrical shorting failures.

Note that the embedded DRAM device 190 of FIG. 1B may include fewer or additional packaging components and/or materials based on the desired packaging design.

Figure 2I:
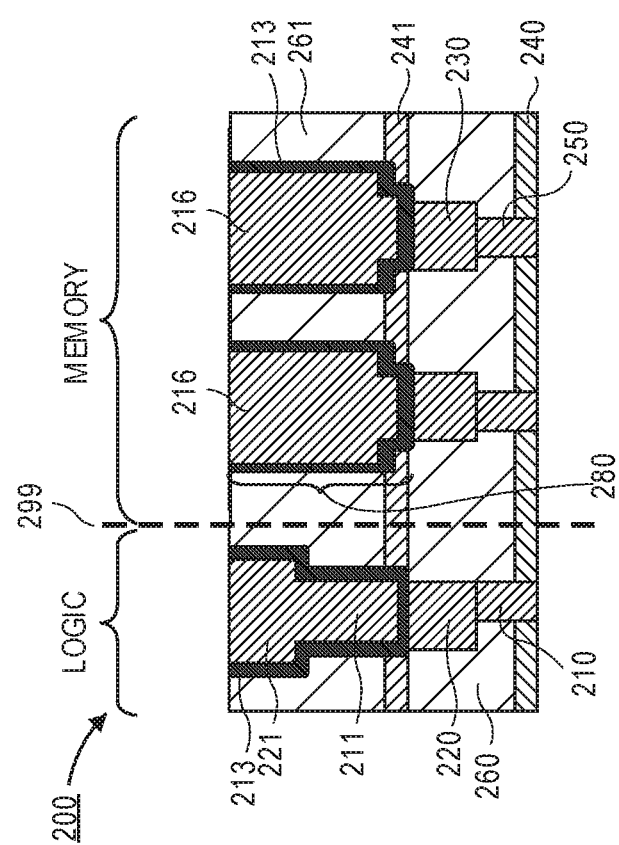
Figure 2O:
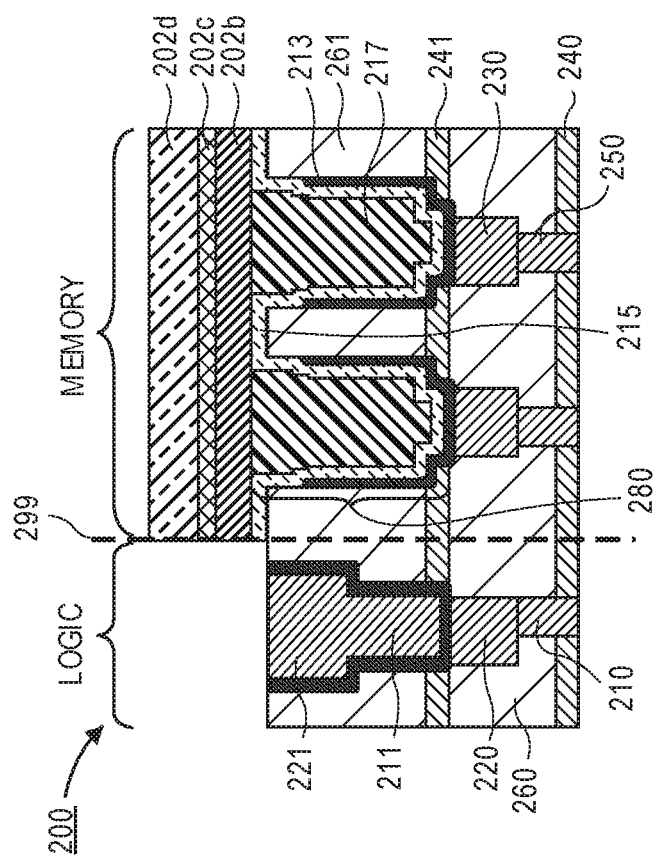
Figure 2P:
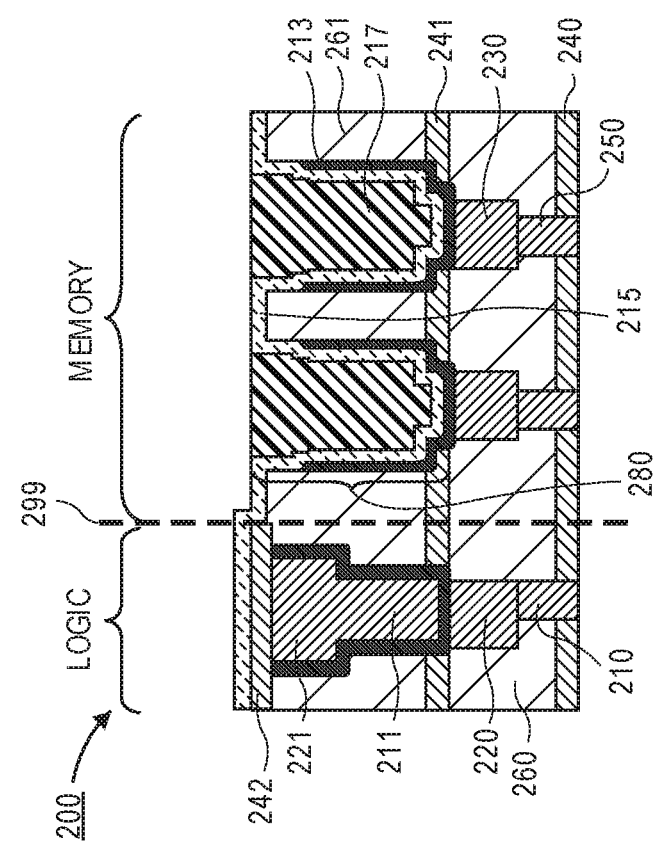
Figure 2S:
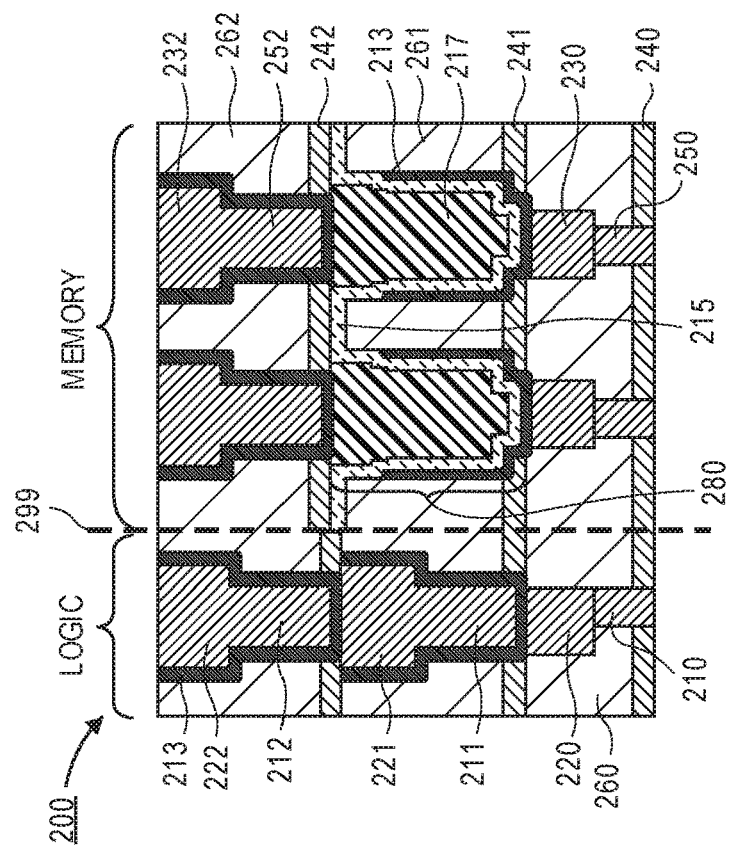
Figure 2T:
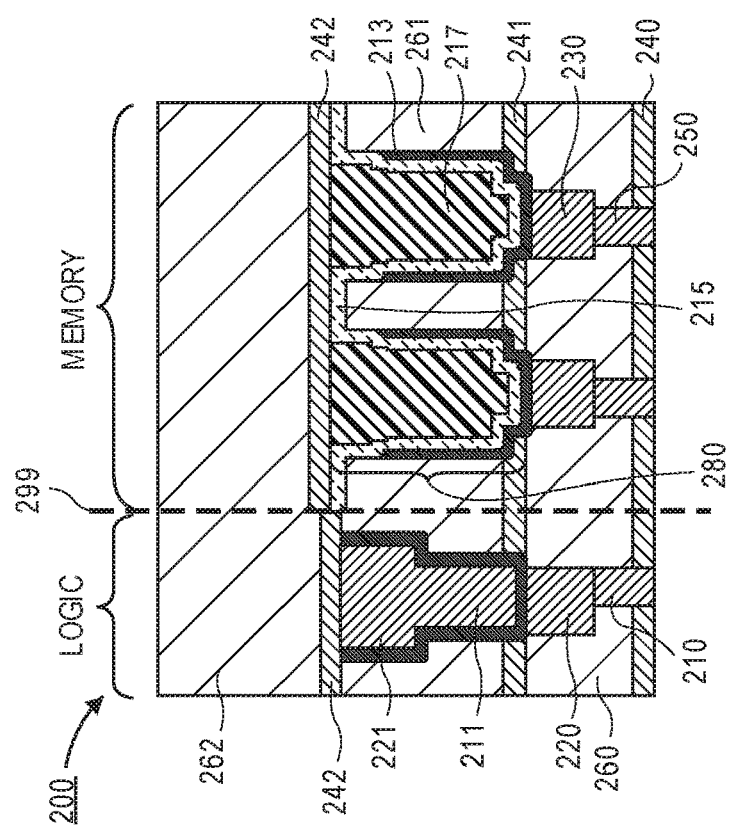

FIGS. 2A-2T are illustrations of cross-sectional views of a process flow of forming an embedded DRAM device 200 including one or more ferroelectric capacitors 280 and a high-k ferroelectric layer 215, where the high-k ferroelectric layer 215 surrounds an electrode layer 213 and extends along a top surface of an ILD layer 261, according to some embodiment.

These embodiments as shown with respect to FIGS. 2A-2T provide a process flow that may use a litho process to form the ferroelectric capacitors 280 and the high-k ferroelectric layer 215. Additionally, these embodiments as shown with respect to FIGS. 2A-2T provide a process flow that may be used to form the logic and memory areas of the embedded DRAM device 200 using the same litho process. The process flow illustrated with FIGS. 2A-2T offers two sets of steps as shown in FIGS. 2O-2P or FIGS. 2Q-2R (i.e., one of these sets of steps may be optional) to pattern and form the high-k ferroelectric layer 215. These embodiments of the embedded DRAM device 200 utilize the high-k ferroelectric layer 215 as both a layer for forming a ferroelectric capacitor and a layer for protecting against an etching process and/or an electrical shorting. The process flow shown with FIGS. 2A-2T may enable the top via 252 to be directly disposed on/above the top surface of the ferroelectric capacitor 280—without needing a top hat metal layer—where the high-k ferroelectric layer 215 (i) acts as a blocking layer to prevent any electrical shorting (e.g., as shown with the embedded DRAM device 190 of FIG. 1B), and (ii) enables a negligible (or minimal) topology z-height difference between the memory and the logic areas, thus reducing the transition region for pitch grading. In addition, the embodiments described herein enhance the embedded DRAM technology by providing the embedded DRAM device 200 which includes denser memory solutions (e.g., as compared to a SRAM device) and faster solutions that may be used to replace, for example, a cache memory in a CPU. For one embodiment, the embedded DRAM device 200 shown in FIGS. 2A-2T may be similar to the embedded DRAM device 100 of FIG. 1.

One such embodiment is illustrated and described based on FIGS. 2A-2T, which illustrates cross-sectional views of the embedded DRAM device 200 having one or more metal layers, the ferroelectric capacitors 280, and the high-k ferroelectric layer 215. In the illustrated embodiments, the patterning and depositing of the build-up layers, such as the ILD layers 260-262 and the M1-M3 layers, in the embedded DRAM device 200 is shown, however it is to be appreciated that the illustrated features are not limiting and may be formed using different or less processing operations and/or different materials. Note that well-known features of FIGS. 2A-2F are omitted or simplified in order not to obscure the illustrative implementations.

Additionally, in these illustrated embodiments, the ferroelectric capacitor 280 is illustrated as having a substantially rectangular cross-section (or a substantially rectangular cylinder cross-section). However, it is to be appreciated that the cross-section of the ferroelectric capacitor 280 may be any shape, depending on the needs of the device. For example, while the sidewall surfaces of the ferroelectric capacitor 280 are illustrated as being substantially vertical, it is to be appreciated that the sidewall surfaces may comprise a taper, a slope, or any other non-planar and/or non-vertical profile. In an embodiment, the ferroelectric capacitors 280 may be formed in more than one ILD layers.

Referring now to FIG. 2A, the process flow illustrates the embedded DRAM device 200 a first ILD layer 260 having a M1 layer that includes vias 210 and 250 and traces 220 and 230, a second ILD layer 261, and a stack 202 (or a four-layer stack) having an intermediary layer 202*a*, a carbon hard mask (CHM) layer 202*b*, a silicon-Containing anti-reflective coating (SiARC) layer 202*c*, and a resist layer 202*d*. Note that, in the embodiments described herein, the one or more components/layers of the embedded DRAM device 200 are similar to the components/layers of the embedded DRAM device 100 of FIG. 1A. As shown, the embedded DRAM device 200 includes a memory area and a logic area separated by an interface 299.

The embedded DRAM device 200 may have a tri-layer (and/or a four-layer) stacked structure disposed on the ILD layer 261. In one embodiment, the intermediary layer 202*a* may include dielectric materials, such as an oxide layer (e.g., S1O2), a nitride layer (e.g., S13N4), or the like. In some embodiments, the intermediary layer 202*a* may be formed on the surface of the ILD layer 261. In some embodiments, vapors may be introduced into a chamber to form the desired intermediary layer 202. The CHM layer 202*b* may be an organic planarization layer (OPL) or an organic layer, for example, in some embodiments, the CHM layer 202*b* may be any type of carbon hard mask layer, an organic dielectric layer (ODL), an amorphous silicon layer, and/or an oxide layer. In an embodiment, the CHM layer 202*b* may be deposited on the intermediary layer 202*a* by a coating process or the like. Next, the SiARC layer 202*c* may be deposited (or spun) onto the CHM layer 202*b* by using a coating process. In addition, the resist layer 202*d* may be deposited or coated onto the SiARC layer 202*c*. The resist layer 202*d* may be a photosensitive patternable photoresist layer which is spun onto the surface of the SiARC layer 202*c* using a coating process or the like.

FIG. 2B illustrates etching (or patterning) the stack 202 and the ILD layer 261 to form one or more openings (or trenches) 201*a-b* in the embedded DRAM device 200. The stack 202 and the ILD layer 261 may be etched with various exposure and developing processes. For example, the resist layer 202*d* may be exposed to light at extreme ultraviolet (EUV) or ultraviolet (UV) frequencies in a pattern defined by a pattern mask. In an embodiment, the resist layer 202*d* may harden in certain areas as defined by the exposure mask, and remain unhardened in other areas. As such, the one or more openings 201*a-c* may be etched with any exposure and mask process that is available for photolithography processes. For example, the stack 202 may be etched using a dry etch process, such as a plasma etch process, and/or a wet etch process.

FIG. 2C illustrates removing the tri-layer of the stack 202 (i.e., the three top layers 202*b-d*) from above the intermediary layer 202*a*. Additionally, the embedded DRAM device 200 includes disposing a sacrificial layer 203 (or a sacrificial material) into the one or more openings 201*a-b*. FIG. 2D illustrates disposing the tri-layer stack 202*b-d* on the intermediary layer 202*a* and the sacrificial layer 202 in the logic area, while the sacrificial layers 203 in the memory area are removed, which leaves the openings 201*b-c* exposed.

FIG. 2E illustrates further etching the openings 201*b-c* to form one or more openings 204*a-b* that may be subsequently used to form one or more COBs (e.g., as shown in FIGS. 2N-2R). FIG. 2F illustrates disposing additional CHM layers 202*b* into the trenches 204*a-b*. Additionally, the embedded DRAM device 200 includes disposing the SiARC layer 202*c* and the resist layer 202*d* on the CHM layer 202*b* to form a planar (or leveled) surface with approximately the same z-heights in the logic and memory area. FIG. 2G illustrates via litho/via etching processes used to form one or more openings 205*a-c* that are subsequently used to form the via 211. FIG. 2H illustrates removing the tri-layer stack 202*b-d* to form one or more openings 206*a-c*, using any etching process or the like. The openings 206*b-c* may be the one or more trenches used to form the ferroelectric capacitors 280 of the embedded DRAM device 200 as shown in FIG. 2T. Note that, in one embodiment, the logic area is implemented with the same patterning as existing dual damascene processes.

FIG. 2I illustrates disposing one or more electrode layers 213 (or bottom electrode layers, second electrode layers, etc.) into the openings 206*a-c* in both the memory and logic areas of the embedded DRAM device 200. The electrode layer 213 may be formed along the outer walls (or edges) of the respective openings 206*a-c*, where the electrode layer 213 thus creates a separation between the ILD layer 261 and the openings 206*a-c*. Additionally, in some embodiments, FIG. 2I also illustrates disposing a conductive material above the electrode layers 213 and into the openings 206*a-c* of the embedded DRAM device 200. In some embodiments, the conductive material disposed into the opening 206*a* thus forms a M2 via 211 and a M2 trace 221 in the logic area.

In some embodiments, the electrode layer 213 may be an electrically insulating sidewall that may include an oxide, e.g., silicon oxide, or in others embodiments the electrode layer 213 may include a nitride, e.g., silicon nitride. In other embodiments, the electrode layer 213 is a TaN layer. In other embodiments, the electrode layer 213 may also be referred to as a "thin via" layer that surrounds the respective via and/or trace. In other embodiments, the electrode layer 113 may include any insulating material, e.g., one or more polymer materials. In one embodiment, the electrode layer 213 may be disposed/deposited into the openings 206*a-c*—as a spacer between the ILD layer 261—using a blanket deposition technique, e.g., CVD, sputtering, or any other know thin film deposition technique.

In some embodiments, the electrode layer 213 may include one or more conductive materials or metals, including ruthenium, tungsten, copper, aluminum, tantalum nitride, titanium nitride, and/or any stack or other combination of these metals. According to some embodiments, the electrode layer 113 may have a thickness between approximately 2 nm to 10 nm. The conductive material may include one or more metals, one or more electrically conductive materials, alloys, and/or a stack of multiple electrically conductive materials. In some embodiments, the one or more conductive materials may include one or more metals or metal alloys, including, for example, ruthenium, palladium, platinum, cobalt, nickel, hafnium, zirconium, titanium, tantalum, and/or aluminum. In some embodiments, the conductive material may also include one or more electrically conductive alloys oxides or carbides of one or more metals. In some embodiments, disposing the conductive material into the openings 206a-b may be implemented using any suitable known deposition and patterning techniques, such as, for example, dual damascene process techniques, ALD, CVD, PVD, and/or any other various lithographic techniques (e.g., photolithography or electron-beam lithography).

FIG. 2J illustrates removing the conductive material from above the electrode layers 213 in the memory area of the embedded DRAM device 200. In some embodiments, the embedded DRAM device 200 includes removing the conductive material in the memory area to form one or more trenches 207a-b (or the COB trenches), where the trenches 207a-b are surrounded by the electrode layers 213. For one embodiment, the conductive material in the memory area is removed using any etching process or the like. Additionally, the embedded DRAM device 200 also includes disposing an etch stop layer 242 and the tri-layer stack 202b-d above the ILD layer 261, the electrode layer 213, and the conductive material in the logic area, where the tri-layer stack 202b-d is disposed on the etch stop layer 242.

FIG. 2K illustrates disposing a sacrificial material 208 (e.g., a sacrificial metal) above the electrode layers 213 in the trenches 207a-b. FIG. 2L illustrates recessing top portions of the sacrificial material 208 and the electrode layer 213 in the trenches 207a-b to form one or more openings 209a-b. In some embodiments, the openings 209a-b are formed in order to have the electrode layers 213 recessed within the trenches 207a-b, thus enabling a high-k ferroelectric layer to be subsequently disposed above the recessed electrode layer 213 to protect against any misalignment and/or electrical shorting failures/problems.

FIG. 2M illustrates disposing a high-k ferroelectric layer 215 above the top surfaces in the logic and memory areas, where the high-k ferroelectric layer 215 is disposed on the etch stop layer 242 in the logic area and on the ILD layer 261 and the electrode layers 213 in the trenches 207a-b. In some embodiments, the high-k ferroelectric layer 215 surrounds the electrode layers 213 and extends along the top surfaces of the ILD layer 261 in the memory area of the embedded DRAM device 200.

In some embodiments, the high-k ferroelectric layer 215 may be a Hf-based ferroelectric material with high-k properties which enables the high-k ferroelectric layer 215 to be highly resistive to oxide etching. Additionally, in some embodiments, the high-k ferroelectric layer 215 may have a thickness of approximately 5 nm, while in other embodiments the high-k ferroelectric layer 215 may have a thickness between approximately 2 nm to 10 nm.

FIG. 2N illustrates disposing one or more electrode layers 217 (or a top electrode layer, a second electrode layer, etc.) above the top surface of the high-k ferroelectric layer 215 in the logic and memory areas, where the electrode layers 217 are disposed on the high-k ferroelectric layers 215 in the trenches 207a-b. In some embodiments, the electrode layer 217 surrounds the high-k ferroelectric layer 215 in the trenches 207a-b in the memory area of the embedded DRAM device 200.

In some embodiments, the electrode layer 217 may include one or more conductive materials (or metals), including ruthenium, tungsten, copper, aluminum, tantalum nitride, titanium nitride, and/or any stack or other combination of these metals. In other embodiments, the electrode layers 213 and 217 may also include different materials from each other to help with the different requirements of the bottom and top capacitor plates. Specific annealing and deposition temperatures of these metals and their crystalline quality may be selected to improve the quality of the ferroelectric capacitors. According to some embodiments, the electrode layers 213 and 217 may have a similar thickness between approximately 2 nm to 10 nm, or in other embodiments may have different thickness, where each of the bottom and top electrode layers 213 and 217 may have a thickness between approximately 2 nm to 10 nm.

As described above, the process flow enables two sets of steps as shown in FIGS. 2O-2P or FIGS. 2Q-2R (i.e., one of these sets of steps may be optional) to pattern and form the high-k ferroelectric layer 215. In particular, FIGS. 2O-2P illustrate a first process of removing the high-k ferroelectric layer 215 in the logic area by implementing a litho/etching process that uses a block mask. Alternatively, FIGS. 2Q-2R illustrate a second process of removing the high-k ferroelectric layer 215 by implementing a polishing process. Accordingly, if the process flow implements FIGS. 2O-2P, then the process flow may proceed to the step illustrated at FIG. 2S. Likewise, if the process flow implements FIGS. 2Q-2R, the process flow thus implements the step illustrated at FIG. 2N and then proceed to the step illustrated at FIG. 2Q.

Referring now to FIG. 2O, the process flow illustrates recessing the electrode layer 217 to expose the top surface of the high-k ferroelectric layer, where the electrode layer 217 in the memory area is recessed (or planarized) to be approximately on the same surface (or plane) as the top surface of the high-k ferroelectric layer 215. Thereafter, FIG. 2P illustrates removing the high-k ferroelectric layer 215 and the etch stop layer 242 in the logic area to expose the top surface of the M2 trace 221, and disposing the tri-layer stack 202b-d on the top surfaces of the high-k ferroelectric layer 215 and the electrode layer 217 in the memory area. In one embodiment, the high-k ferroelectric layer 215 and the etch stop layer 242 in the logic area in the logic area may be removed using a block mask and implementing a litho/etching process. As such, in the logic area, the top surfaces of the ILD layer 261, the electrode layer 213, and the M2 trace 221 may be approximately planar to each other.

Alternatively, FIG. 2Q illustrates recessing the electrode layer 217 in the logic and memory areas, and the high-k ferroelectric layer 215 in the logic area by using a polishing process. In some embodiments, the polishing process may recess both the electrode layer 217 and the high-k ferroelectric layer 215 in the logic area to expose the top surface of the etch stop layer 242. Note that, in some embodiments, the electrode layer 217 in the memory area may be flooded above the ferroelectric layer 215, where the top surface of the electrode layer 217 in the memory area may be approximately planar to the top surface of the etch stop layer 242 in the logic area.

FIG. 2R illustrates recessing the high-k ferroelectric layer 215 and the etch stop layer 242 in the logic and memory areas (i) to expose the top surfaces of the high-k ferroelectric layer 215 in the memory area and (ii) to expose the top surface of the M2 trace 221 in the logic area. As such, in the logic area, the top surfaces of the ILD layer 261, the electrode layer 213, and the M2 trace 221 may be approximately planar to each other. Likewise, in the memory area, the top surfaces of the high-k ferroelectric layer 215 and the top surfaces of the electrode layer 217 may be approximately planar to each other. In addition, as illustrated in FIG. 2R, the top surfaces in the logic and memory areas may be approximately planar to each other.

FIG. 2S illustrates disposing the etch stop layer 242 over the top surfaces in the logic and memory areas. In some embodiments, the etch stop layer 242 may cover the top surfaces of the ILD layer 261 and the M2 trace 221 in the logic area. Additionally, in some embodiments, the etch stop layer 242 may cover the top surfaces of the high-k ferroelectric layer 215 and the electrode layer 217 in the memory area. Accordingly, as shown in FIG. 2S, the ferroelectric capacitors 280 are now formed in the memory area, where the high-k ferroelectric layer 215 is thus surrounding the electrode layer 213 and extending along the top surface of the ILD layer 261. In some embodiments, the etch layers 240-242 may include one or more etch resistant materials, such as, but are not limited to TiO, ZrO, AlN, ZrAlTiO, AlO, and/or the like.

For some embodiments, after disposing the etch stop layer 242, the process flow may dispose an ILD layer 262 above the etch stop layer 242 in both areas. In some embodiments, the ILD layers 260-262 may include one or more dielectric materials having a high-k dielectric, such as elements include hafnium, silicon, oxygen, titanium, tantalum, lanthanum, aluminum, zirconium, barium, strontium, yttrium, lead, scandium, niobium, and/or zinc. Examples of high-k materials that may be used in the ILD layers 260-262 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and/or lead zinc niobate.

In other embodiments, the ILD layers 260-262 may be formed using dielectric materials having low-k dielectric materials. Examples of such dielectric materials that may be used include, but are not limited to, $SiO_2$, CDO, silicon nitride, organic polymers such as perfluorocyclobutane or polytetrafluoroethylene, FSG, and/or organosilicates, such as silsesquioxane, siloxane, or organosilicate glass. For some embodiments, the ILD layers 260-262 may include pores or air gaps to further reduce their dielectric constant.

FIG. 2T illustrates disposing (or forming) a M3 layer in the ILD layer 262 to finalize the illustrated three layers of the embedded DRAM device 200, where the M3 layer includes forming M3 vias 212 and 252 and M3 traces 222 and 232. In some embodiments, the vias 212 and 252 of the M3 layer may be disposed directly above (or approximately above) the trace 221 and the top electrode layer 217 of the M2 layer, respectively. In various embodiments, each of the M1-M3 layers may include one or more electrically conductive materials such as any suitable electrically conductive material, alloy, or a stack of multiple electrically conductive materials. In an embodiment, the M1-M3 traces 220-222 and 230-232 and the M1-M3 vias 210-212 and 250-252 may be comprised of one or more metal or other conductive materials. The M1-M3 layers may include one or more metal materials including alloys, stacks, and/or any other combinations of multiple metals. In some embodiments, the M1-M3 layers may also include metals or metal alloys, including, for example, ruthenium, palladium, platinum, cobalt, nickel, hafnium, zirconium, titanium, tantalum, and/or aluminum. In some embodiments, various electrically conductive materials described herein may also include one or more electrically conductive alloys oxides or carbides of one or more metals. For some embodiments, the M1-M3 layers may be formed using any suitable known deposition and patterning techniques, such as, for example, dual damascene process techniques, ALD, CVD, PVD, and any other various lithographic techniques (e.g., photolithography or electron-beam lithography).

In addition, as described above, the M1 vias 210 and 250 (or the bottommost metal layer) may be disposed/formed or carried out on a substrate, such as a package substrate, a PCB, and/or a motherboard. In one embodiment, the substrate may be a crystalline substrate formed using a bulk silicon or a silicon-oninsulator substructure. In other embodiments, the substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, and/or other combinations of group III-V, group II-VI, or group IV materials. Although a few examples of materials from which the substrate may be formed are described here, any material that may serve as a foundation (or a foundation layer) upon which a semiconductor device may be built may be included (or considered) a substrate.

Note that the embedded DRAM device 200 as shown in FIGS. 2A-2T may include fewer or additional packaging components and/or materials based on the desired packaging design.

Figure 3B:
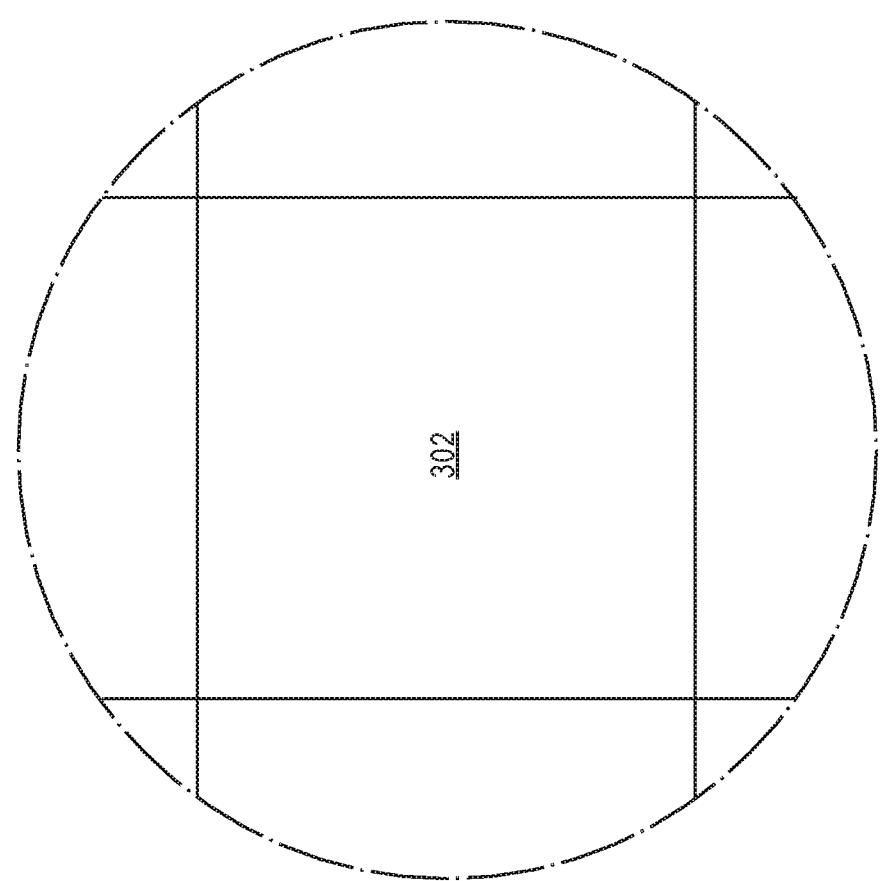
FIGS. 3A and 3B are illustrations of top views of an electronic device having a wafer and dies with one or more embedded non-volatile memory structures that include an embedded DRAM device, according to some embodiments.
Figure 3A:
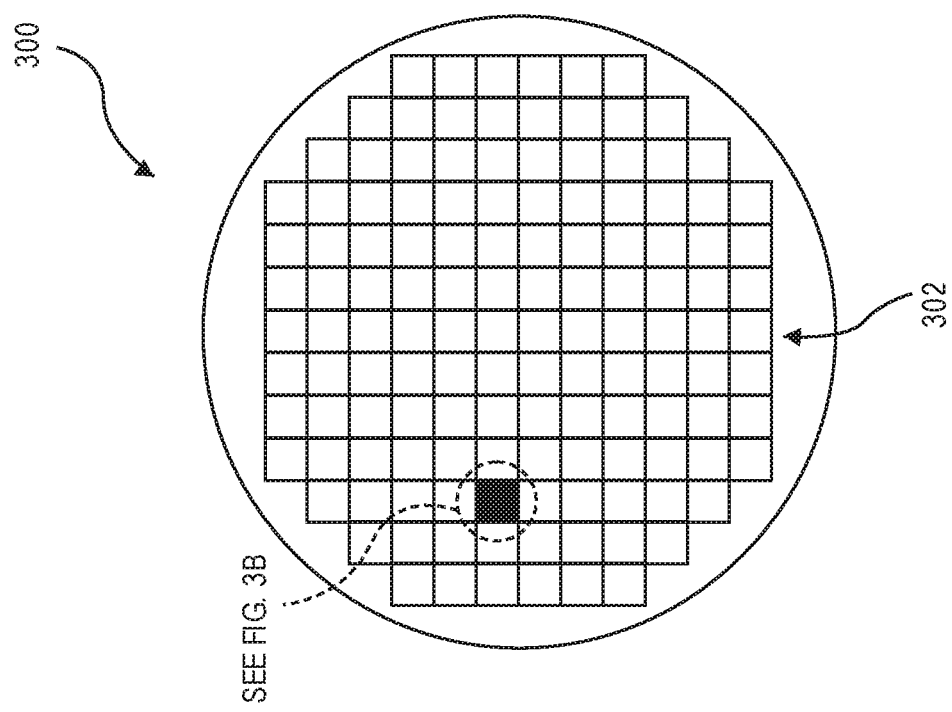

Referring now to FIGS. 3A-3B. The integrated circuit structures described herein may be included in an electronic device. As an example of one such apparatus, FIGS. 3A and 3B are top views of a wafer 300 and dies 302 that include one or more embedded non-volatile memory structures, which may include one or more embedded DRAM devices having a COB and a high-k ferroelectric layer, where the high-k ferroelectric layer may surround an electrode layer and extend along a top surface of an ILD layer (e.g., as shown with the embedded DRAM device 100 of FIGS. 1A-1B), in accordance with one or more of the embodiments described herein.

As illustrated in FIGS. 3A-3B, a wafer 300 may be composed of semiconductor material and may include one or more dies 302 having integrated circuit (IC) structures formed on a surface of the wafer 300. Each of the dies 302 may be a repeating unit of a semiconductor product that includes any suitable ICs, including the embedded DRAM device described herein which implements a COB and a high-k ferroelectric layer, where the high-k ferroelectric layer surrounds an electrode layer and extends along a top surface of an ILD layer (e.g., as shown with the embedded DRAM device 100 of FIGS. 1A-1B). After the fabrication of the semiconductor product is complete, the wafer 300 may undergo a singulation process in which each of the dies 302 is separated from one another to provide discrete "chips" of the semiconductor product. In particular, structures that include embedded non-volatile memory structures having an independently scaled selector as described herein may take the form of the wafer 300 (e.g., not singulated) or the form of the die 302 (e.g., singulated). The die 302 may include one or more embedded non-volatile memory structures based independently scaled selectors and/or supporting circuitry to route electrical signals, as well as any other IC components. In some embodiments, the wafer 300 or the die 302 may include an additional memory device (e.g., an embedded DRAM device as described herein), a logic device (e.g., an AND, OR, NAND, or NOR gate), or any other suitable circuit element. Multiple ones of these devices may be combined on a single die 302. For example, a memory array formed by multiple memory devices may be formed on a same die 302 as a processing device or other logic that is configured to store information in the memory devices or execute instructions stored in the memory array.

Embodiments described herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches described herein.

Note that the wafer 300 and/or the die 302 may include fewer or additional components and/or materials based on the desired packaging design.

Figure 4:
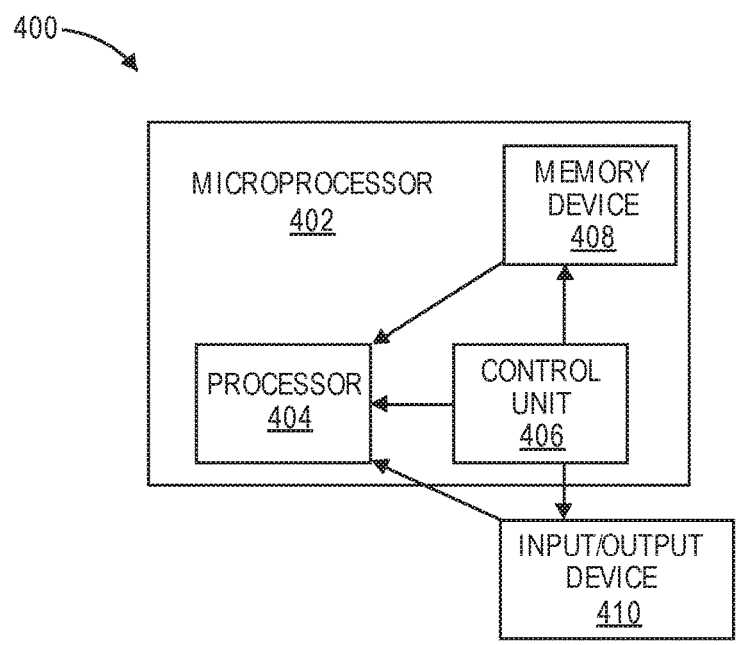
FIG. 4 is a schematic block diagram illustrating an electronic system that utilizes an input/output (I/O) device and a semiconductor package, which includes a processor, a memory device, and a control unit, according to one embodiment.

FIG. 4 is a schematic block diagram illustrating an electronic system 400 that utilizes an input/output (I/O) device 410 and a microprocessor 402, which includes a processor 404, a memory device 408, and a control unit 406, according to one embodiment. FIG. 4 is an illustration of an electronic system 400, according to one embodiment. The electronic system 400 can correspond to, for example, a portable system, a computer system, a process control system, or any other system that utilizes a processor and an associated memory. The electronic system 400 may include the microprocessor 402, the processor 404, the control unit 406, the memory device 408, and the I/O device 410. Note that it is to be appreciated that the electronic system 400 may have a plurality of processors, control units, memory device units, and/or I/O devices in various embodiments. In one embodiment, the electronic system 400 has a set of instructions that define operations which are to be performed on data by the processor 404, as well as, other transactions between the processor 404, the memory device 408, and the I/O device 410. The control unit 406 coordinates the operations of the processor 404, the memory device 408 and the I/O device 410 by cycling through a set of operations that cause instructions to be retrieved from the memory device 408 and executed. The memory device 408 can include a non-volatile memory cell as described above (e.g., the embedded DRAM device 100 of FIGS. 1A-1B). In an embodiment, the memory device 408 is embedded in the microprocessor 402, as illustrated in FIG. 4. In another embodiment, the processor 404, or another component of the electronic system 400, may include one or more embedded non-volatile memory structures, such as the embedded DRAM device described herein that implements a COB and a high-k ferroelectric layer, where the high-k ferroelectric layer may surround an electrode layer and extend along a top surface of an ILD layer (e.g., as shown with the embedded DRAM device 100 of FIGS. 1A-1B).

Note that the electronic system 400 may include fewer or additional packaging components and/or materials based on the desired packaging design.

Figure 5:
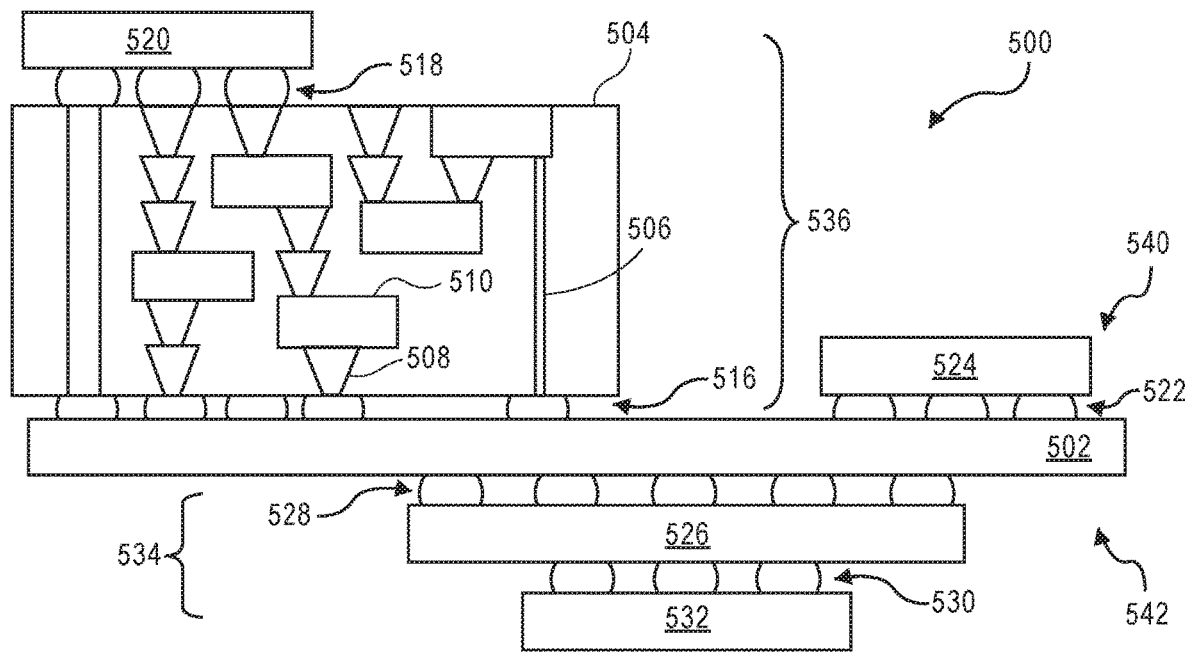
FIG. 5 is a cross-sectional view of an integrated circuit (IC) device assembly that includes one or more embedded non-volatile memory structures having an embedded DRAM device, according to one embodiment.

FIG. 5 is a cross-sectional side view of an IC device assembly which may include one or more embedded non-volatile memory structures having an embedded DRAM device, in accordance with one or more of the embodiments described herein. As illustrated in FIG. 5, an IC device assembly 500 includes components having one or more IC structures as described herein. The IC device assembly 500 includes a number of components disposed on a circuit board 502 (e.g., a motherboard). The IC device assembly 500 includes components disposed on a first face 540 of the circuit board 502 and an opposing second face 542 of the circuit board 502. Generally, components may be disposed on one or both faces 540 and 542. In particular, any suitable ones of the components of the IC device assembly 500 may include a number of embedded non-volatile memory structures that implement a COB and a high-k ferroelectric layer, where the high-k ferroelectric layer may surround an electrode layer and extend along a top surface of an ILD layer (e.g., as shown with the embedded DRAM device 100 of FIGS. 1A-1B).

In some embodiments, the circuit board 502 may be a PCB including multiple metal layers separated from one another by layers of dielectric material and interconnected by electrically conductive vias (e.g., the PCB may include the embedded COB with the high-k ferroelectric layer as described herein). Any one or more of the metal layers may be formed in a desired circuit pattern to route electrical signals (optionally in conjunction with other metal layers) between the components coupled to the circuit board 502. In other embodiments, the circuit board 502 may be a non-PCB substrate.

The IC device assembly 500 illustrated in FIG. 5 includes a package-on-interposer structure 536 coupled to the first face 540 of the circuit board 502 by coupling components 516. The coupling components 516 may electrically and mechanically couple the package-on-interposer structure 536 to the circuit board 502, and may include solder balls (as shown in FIG. 5), male and female portions of a socket, an adhesive, an underfill material, and/or any other suitable electrical and/or mechanical coupling structure.

The package-on-interposer structure 536 may include an IC package 520 coupled to an interposer 504 by coupling components 518. The coupling components 518 may take any suitable form for the application, such as the forms discussed above with reference to the coupling components 516. Although a single IC package 520 is shown in FIG. 5, multiple IC packages may be coupled to the interposer 504. Note that it is to be appreciated that additional interposers may be coupled to the interposer 504. The interposer 504 may provide an intervening substrate used to bridge the circuit board 502 and the IC package 520. The IC package 520 may be or include, for example, a die (e.g., the die 302 of FIG. 3B), or any other suitable component. Generally, the interposer 504 may spread a connection to a wider pitch or reroute a connection to a different connection. For example, the interposer 504 may couple the IC package 520 (e.g., a die) to a ball grid array (BGA) of the coupling components 516 for coupling to the circuit board 502. In the embodiments illustrated in FIG. 5, the IC package 520 and the circuit board 502 are attached to opposing sides of the interposer 504. In other embodiments, the IC package 520 and the circuit board 502 may be attached to a same side of the interposer 504. In some embodiments, three or more components may be interconnected by way of the interposer 504.

The interposer 504 may be formed of an epoxy resin, a fiberglass-reinforced epoxy resin, a ceramic material, or a polymer material such as polyimide. In some implementations, the interposer 504 may be formed of alternate rigid or flexible materials that may include the same materials described above for use in a semiconductor substrate, such as silicon, germanium, and other group III-V and group IV materials. The interposer 504 may include metal interconnects 510 and vias 508, including but not limited to through-silicon vias (TSVs) 506. The interposer 504 may further include embedded devices 514, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 504. The package-on-interposer structure 536 may take the form of any of the package-on-interposer structures known in the art.

The IC device assembly 500 may include an IC package 524 coupled to the first face 540 of the circuit board 502 by coupling components 522. The coupling components 522 may take the form of any of the embodiments discussed above with reference to the coupling components 516, and the IC package 524 may take the form of any of the embodiments described above with reference to the IC package 520.

The IC device assembly 500 illustrated in FIG. 5 includes a package-on-package structure 534 coupled to the second face 542 of the circuit board 502 by coupling components 528. The package-on-package structure 534 may include an IC package 526 and an IC package 532 coupled together by coupling components 530 such that the IC package 526 is disposed between the circuit board 502 and the IC package 532. The coupling components 528 and 530 may take the form of any of the embodiments of the coupling components 516 discussed above, and the IC packages 526 and 532 may take the form of any of the embodiments of the IC package 520 described above. The package-on-package structure 534 may be configured in accordance with any of the package-on-package structures known in the art.

Note that the IC device assembly 500 may include fewer or additional packaging components and/or materials based on the desired packaging design.

Figure 6:
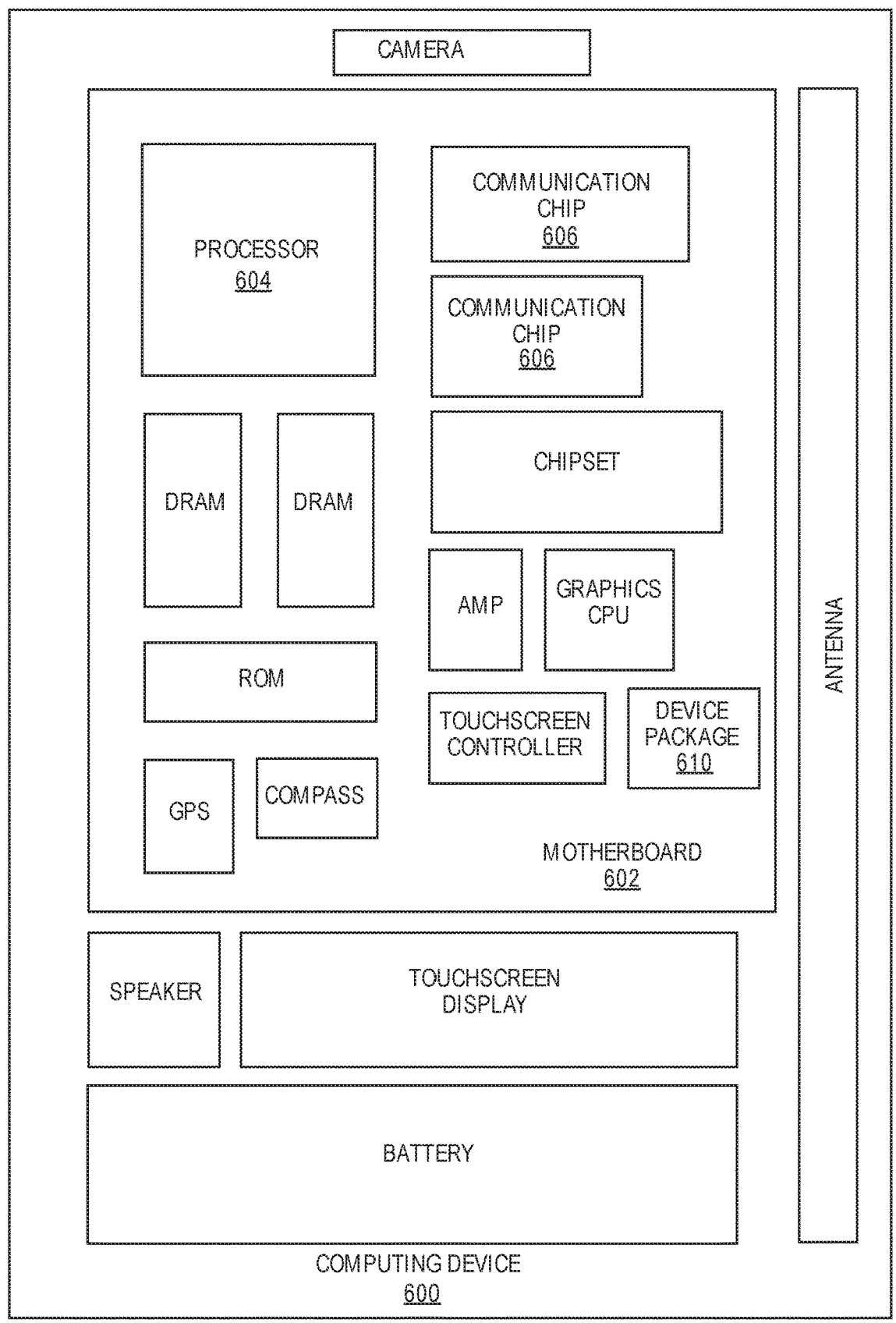
FIG. 6 is a schematic block diagram illustrating a computer system that utilizes a device package having one or more embedded non-volatile memory structures having one or more embedded DRAM devices, according to one embodiment.

FIG. 6 is a schematic block diagram illustrating a computer system that utilizes a device package 610 having an embedded DRAM device with one or more COBs and a high-k ferroelectric layer, where the high-k ferroelectric layer may surround an electrode layer and extend along a top surface of an ILD layer, according to one embodiment. FIG. 6 illustrates an example of computing device 600. Computing device 600 houses motherboard 602. For one embodiment, motherboard 602 may be similar to the circuit board 502 of FIG. 5 (or any substrate described herein that may be used as a base for the embedded DRAM device). Motherboard 602 may include a number of components, including but not limited to processor 604, device package 610 (or semiconductor package), and at least one communication chip 606. Processor 604 is physically and electrically coupled to motherboard 602. For some embodiments, at least one communication chip 606 is also physically and electrically coupled to motherboard 602. For other embodiments, at least one communication chip 606 is part of processor 604.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. Device package 610 may be, but is not limited to, a substrate, a package substrate, and/or a PCB. Device package 610 may include one or more embedded non-volatile memory structures implementing one or more embedded DRAM devices as described herein (e.g., as illustrated in FIGS. 1A-1B and FIGS. 2A-2T). The one or more embedded DRAM devices may include one or more COBs and one or more high-k ferroelectric layers, where the high-k ferroelectric layer may surround electrode layers and extend along top surfaces of one or more ILD layers (e.g., as shown in FIGS. 1A-1B). Device package 610 may also include any other components from the Figures described herein.

Note that device package 610 may be a single component/device, a subset of components, and/or an entire system, as the materials, features, and components may be limited to device package 610 and/or any other component of the computing device 600 that may need an embedded DRAM device as described herein (e.g., the motherboard 602, the processor 604, and/or any other component of the computing device 600). For example, the computing device 600 may use the embedded DRAM device having the high-k ferroelectric layer surrounding an electrode layer, extending along a top surface of an ILD layer, and coupling a bottom surface of a via to prevent any shorting between the via and a bottom electrode (or a first electrode) of the respective COB(s) (i.e., the coupling may occur when the via is misaligned).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 606 also includes an integrated circuit die packaged within the communication chip 606. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is an embedded dynamic random access memory (DRAM) device, comprising of a dielectric layer having a logic area and a memory area; a metal trace and a metal via in the logic area of the dielectric layer; and one or more ferroelectric capacitors in the memory area of the dielectric layer. Each ferroelectric capacitor includes an a first electrode layer, a ferroelectric layer, and a second electrode layer. The ferroelectric layer is between the first electrode layer and the second electrode layer. The ferroelectric layer surrounds the first electrode layer of each ferroelectric capacitor and extends along a top surface of the dielectric layer in the memory area.

In example 2, the subject matter of example 1 can optionally include a first etch stop layer below the dielectric layer; and a second etch stop layer is above a top surface of the metal trace and a top surface of the dielectric layer in the logic area, and the second etch stop layer is above a top surface of the ferroelectric layer and a top surface of the second electrode layer in the memory area.

In example 3, the subject matter of any of examples 1-2 can optionally include a top surface of the second etch stop layer in the logic area has a z-height that is approximately equal to a z-height of a top surface of the second etch stop layer in the memory area.

In example 4, the subject matter of any of examples 1-3 can optionally include a first dielectric layer below the first etch stop layer; one or more first metal traces and one or more first metal vias in the first dielectric layer; a second dielectric layer above the second etch stop layer; and one or more second metal traces and one or more second metal vias in the second dielectric layer.

In example 5, the subject matter of any of examples 1-4 can optionally include the one or more first metal traces positioned below the metal via in the logic area and the one or more ferroelectric capacitors in the memory area. The one or more second metal vias are positioned above the metal trace in the logic area and the one or more ferroelectric capacitors in the memory area.

In example 6, the subject matter of any of examples 1-5 can optionally include the ferroelectric layer which includes one or more ferroelectric materials, including hafnium zirconium oxide (HfZrO), silicon-doped (Si-doped) hafnium oxide, germanium-doped (Ge-doped) hafnium oxide, aluminum-doped (Al-doped) hafnium oxide, and yttrium-doped (Y-doped) hafnium oxide.

In example 7, the subject matter of any of examples 1-6 can optionally include a third etch stop layer below the first dielectric layer.

In example 8, the subject matter of any of examples 1-7 can optionally include the ferroelectric layer having a thickness between approximately 2 nanometer (nm) to 10 nm.

In example 9, the subject matter of any of examples 1-8 can optionally include the first and second electrode layers which include one or more conductive materials, including ruthenium, tungsten, copper, aluminum, tantalum nitride, titanium nitride, and any combination thereof. The first electrode layer has one or more conductive materials that are similar or different to one or more conductive materials of the second electrode layer. The first electrode has a thickness that is approximately equal to or different than a thickness of the second electrode layer.

Example 10 is a method of forming an embedded DRAM device, comprising of disposing a dielectric layer on a first etch stop layer. The dielectric layer has a logic area and a memory area; disposing a metal trace and a metal via in the logic area of the dielectric layer; and disposing one or more ferroelectric capacitors in the memory area of the dielectric layer. Each ferroelectric capacitor includes a first electrode layer, a ferroelectric layer, and a second electrode layer. The ferroelectric layer is between the first electrode layer and the second electrode layer, and wherein the ferroelectric layer surrounds the first electrode layer of each ferroelectric capacitor and extends along a top surface of the dielectric layer in the memory area.

In example 11, the subject matter of example 10 can optionally include disposing a second etch stop layer above a top surface of the metal trace and a top surface of the dielectric layer in the logic area, and the second etch stop layer above a top surface of the ferroelectric layer and a top surface of the second electrode layer in the memory area.

In example 12, the subject matter of any of examples 10-11 can optionally include a top surface of the second etch stop layer in the logic area having a z-height that is approximately equal to a z-height of a top surface of the second etch stop layer in the memory area.

In example 13, the subject matter of any of examples 10-12 can optionally include disposing a first dielectric layer below the first etch stop layer; disposing one or more first metal traces and one or more first metal vias in the first dielectric layer; disposing a second dielectric layer above the second etch stop layer; and disposing one or more second metal traces and one or more second metal vias in the second dielectric layer.

In example 14, the subject matter of any of examples 10-13 can optionally include the one or more first metal traces positioned below the metal via in the logic area and the one or more ferroelectric capacitors in the memory area. The one or more second metal vias are positioned above the metal trace in the logic area and the one or more ferroelectric capacitors in the memory area.

In example 15, the subject matter of any of examples 10-14 can optionally include the ferroelectric layer which includes one or more ferroelectric materials, including HfZrO, Si-doped hafnium oxide, Ge-doped hafnium oxide, Al-doped hafnium oxide, and Y-doped hafnium oxide.

In example 16, the subject matter of any of examples 10-15 can optionally include disposing a third etch stop layer below the first dielectric layer.

In example 17, the subject matter of any of examples 10-16 can optionally include the ferroelectric layer having a thickness between approximately 2 nm to 10 nm.

In example 18, the subject matter of any of examples 10-17 can optionally include the first and second electrode layers which include one or more conductive materials, including ruthenium, tungsten, copper, aluminum, tantalum nitride, titanium nitride, and any combination thereof. The first electrode layer has one or more conductive materials that are similar or different to one or more conductive materials of the second electrode layer. The first electrode has a thickness that is approximately equal to or different than a thickness of the second electrode layer.

Example 19 is a memory device comprising of a semiconductor substrate; and an embedded DRAM above the semiconductor substrate. The embedded DRAM includes a dielectric layer having a logic area and a memory area; a metal trace and a metal via in the logic area of the dielectric layer; and one or more ferroelectric capacitors in the memory area of the dielectric layer. Each ferroelectric capacitor includes an first electrode layer, a ferroelectric layer, and a second electrode layer. The ferroelectric layer is between the first electrode layer and the second electrode layer. The ferroelectric layer surrounds the first electrode layer of each ferroelectric capacitor. The first electrode has a thickness that is approximately equal to or different than a thickness of the second electrode layer.

In example 20, the subject matter of example 19 can optionally include a first etch stop layer below the dielectric layer; and a second etch stop layer is above a top surface of the metal trace and a top surface of the dielectric layer in the logic area, and the second etch stop layer is above a top surface of the ferroelectric layer and a top surface of the second electrode layer in the memory area.

In example 21, the subject matter of any of examples 19-20 can optionally include a top surface of the second etch stop layer in the logic area having a z-height that is approximately equal to a z-height of a top surface of the second etch stop layer in the memory area.

In example 22, the subject matter of any of examples 19-21 can optionally include a first dielectric layer below the first etch stop layer; one or more first metal traces and one or more first metal vias in the first dielectric layer; a second dielectric layer above the second etch stop layer; one or more second metal traces and one or more second metal vias in the second dielectric layer; and a third etch stop layer below the first dielectric layer.

In example 23, the subject matter of any of examples 19-22 can optionally include the one or more first metal traces positioned below the metal via in the logic area and the one or more ferroelectric capacitors in the memory area. The one or more second metal vias are positioned above the metal trace in the logic area and the one or more ferroelectric capacitors in the memory area.

In example 24, the subject matter of any of examples 19-23 can optionally include the ferroelectric layer which includes one or more ferroelectric materials, including HfZrO, Si-doped hafnium oxide, Ge-doped hafnium oxide, Al-doped hafnium oxide, and Y-doped hafnium oxide. The ferroelectric layer has a thickness between approximately 2 nm to 10 nm.

In example 25, the subject matter of any of examples 19-24 can optionally include the first and second electrode layers which include one or more conductive materials, including ruthenium, tungsten, copper, aluminum, tantalum nitride, titanium nitride, and any combination thereof. The first electrode layer has one or more conductive materials that are similar or different to one or more conductive materials of the second electrode layer. The first electrode has a thickness that is approximately equal to or different than a thickness of the second electrode layer.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. An embedded dynamic random access memory (DRAM) device, comprising:
   a dielectric layer having a logic area and a memory area, the dielectric layer having an uppermost surface;
   a metal trace and a metal via in the logic area of the dielectric layer; and
   one or more ferroelectric capacitors in the memory area of the dielectric layer, wherein each ferroelectric capacitor includes a first electrode layer, a ferroelectric layer, and a second electrode layer, wherein the ferroelectric layer is between the first electrode layer and the second electrode layer, wherein the ferroelectric layer surrounds the second electrode layer of each ferroelectric capacitor and extends along a top surface of the dielectric layer in the memory area, wherein the ferroelectric layer extends laterally beyond the second electrode layer of each ferroelectric capacitor, wherein the ferroelectric layer has an uppermost surface at a same level as an uppermost surface of the second electrode layer, and wherein the first electrode layer has an uppermost surface below the uppermost surface of the dielectric layer.

2. The embedded DRAM device of claim 1, further comprising:
   a first etch stop layer is below the dielectric layer; and
   a second etch stop layer is above a top surface of the metal trace and a top surface of the dielectric layer in the logic area, and the second etch stop layer is above a top surface of the ferroelectric layer and a top surface of the second electrode layer in the memory area.

3. The embedded DRAM device of claim 2, wherein a top surface of the second etch stop layer in the logic area has a z-height that is approximately equal to a z-height of a top surface of the second etch stop layer in the memory area.

4. The embedded DRAM device of claim 2, further comprising:
   a first dielectric layer below the first etch stop layer;
   one or more first metal traces and one or more first metal vias in the first dielectric layer;

a second dielectric layer above the second etch stop layer; and one or more second metal traces and one or more second metal vias in the second dielectric layer.

5. The embedded DRAM device of claim 4, wherein the one or more first metal traces are positioned below the metal via in the logic area and the one or more ferroelectric capacitors in the memory area, and wherein the one or more second metal vias are positioned above the metal trace in the logic area and the one or more ferroelectric capacitors in the memory area.

6. The embedded DRAM device of claim 1, wherein the ferroelectric layer includes one or more ferroelectric materials, including hafnium zirconium oxide (HfZrO), silicon-doped (Si-doped) hafnium oxide, germanium-doped (Ge-doped) hafnium oxide, aluminum-doped (Al-doped) hafnium oxide, and yttrium-doped (Y-doped) hafnium oxide.

7. The embedded DRAM device of claim 1, further comprising a third etch stop layer below the dielectric layer.

8. The embedded DRAM device of claim 1, wherein the ferroelectric layer has a thickness between approximately 2 nanometer (nm) to 10 nm.

9. The embedded DRAM device of claim 1, wherein the first and second electrode layers include one or more conductive materials, including ruthenium, tungsten, copper, aluminum, tantalum nitride, titanium nitride, and any combination thereof, wherein the first electrode layer has one or more conductive materials that are similar or different to one or more conductive materials of the second electrode layer, and wherein the first electrode has a thickness that is approximately equal to or different than a thickness of the second electrode layer.

10. A memory device, comprising:
a semiconductor substrate; and
an embedded DRAM above the semiconductor substrate, wherein the embedded DRAM includes
a dielectric layer having a logic area and a memory area, the dielectric layer having an uppermost surface;
a metal trace and a metal via in the logic area of the dielectric layer; and
one or more ferroelectric capacitors in the memory area of the dielectric layer, wherein each ferroelectric capacitor includes a first electrode layer, a ferroelectric layer, and a second electrode layer, wherein the ferroelectric layer is between the first electrode layer and the second electrode layer, and wherein the ferroelectric layer surrounds the second electrode layer of each ferroelectric capacitor and extends along a top surface of the dielectric layer in the memory area, wherein the ferroelectric layer extends laterally beyond the second electrode layer of each ferroelectric capacitor, wherein the ferroelectric layer has an uppermost surface at a same level as an uppermost surface of the second electrode layer, and wherein the first electrode layer has an uppermost surface below the uppermost surface of the dielectric layer.

11. The memory device of claim 10, further comprising:
a first etch stop layer is below the dielectric layer; and
a second etch stop layer is above a top surface of the metal trace and a top surface of the dielectric layer in the logic area, and the second etch stop layer is above a top surface of the ferroelectric layer and a top surface of the second electrode layer in the memory area.

12. The memory device of claim 11, wherein a top surface of the second etch stop layer in the logic area has a z-height that is approximately equal to a z-height of a top surface of the second etch stop layer in the memory area.

13. The memory device of claim 11, further comprising:
a first dielectric layer below the first etch stop layer;
one or more first metal traces and one or more first metal vias in the first dielectric layer;
a second dielectric layer above the second etch stop layer;
one or more second metal traces and one or more second metal vias in the second dielectric layer; and
a third etch stop layer below the first dielectric layer.

14. The memory device of claim 13, wherein the one or more first metal traces are positioned below the metal via in the logic area and the one or more ferroelectric capacitors in the memory area, and wherein the one or more second metal vias are positioned above the metal trace in the logic area and the one or more ferroelectric capacitors in the memory area.

15. The memory device of claim 10, wherein the ferroelectric layer includes one or more ferroelectric materials, including HfZrO, Si-doped hafnium oxide, Ge-doped hafnium oxide, Al-doped hafnium oxide, and Y-doped hafnium oxide, and wherein the ferroelectric layer has a thickness between approximately 2 nm to 10 nm.

16. The memory device of claim 10, wherein the first and second electrode layers include one or more conductive materials, including ruthenium, tungsten, copper, aluminum, tantalum nitride, titanium nitride, and any combination thereof, wherein the first electrode layer has one or more conductive materials that are similar or different to one or more conductive materials of the second electrode layer, and wherein the first electrode has a thickness that is approximately equal to or different than a thickness of the second electrode layer.

* * * * *